United States Patent [19]

Watanabe

[11] Patent Number: 5,605,775
[45] Date of Patent: Feb. 25, 1997

[54] PHOTOMASK USED BY PHOTOLITHOGRAPHY AND A PROCESS OF PRODUCING SAME

[75] Inventor: Hisashi Watanabe, Kyoto, Japan

[73] Assignee: Matsushita Electronics Corporation, Osaka, Japan

[21] Appl. No.: 81,835

[22] Filed: Jun. 24, 1993

Related U.S. Application Data

[63] Continuation of Ser. No. 718,337, Jun. 19, 1991.

[30] Foreign Application Priority Data

Jun. 21, 1990 [JP] Japan ..................... 2-163343

[51] Int. Cl.$^6$ ........................................ G03F 9/00
[52] U.S. Cl. ................. 430/5; 430/318; 430/323; 430/272.1
[58] Field of Search ................. 430/5, 270, 318, 430/323

[56] References Cited

U.S. PATENT DOCUMENTS

| | | | |
|---|---|---|---|
| 3,771,872 | 11/1973 | Nightingdale et al. | 430/5 |
| 4,686,162 | 8/1987 | Stangl et al. | 430/5 |
| 4,762,396 | 8/1988 | Dumant et al. | 430/5 |
| 5,045,417 | 9/1991 | Kamoto | 430/5 |
| 5,100,503 | 3/1992 | Allman et al. | 430/5 |

FOREIGN PATENT DOCUMENTS

| | | |
|---|---|---|
| 62-92438 | 4/1987 | European Pat. Off. . |
| 0383534 | 2/1990 | European Pat. Off. . |
| 0395425 | 4/1990 | European Pat. Off. . |
| 0401795 | 6/1990 | European Pat. Off. . |
| 0424963A2 | 5/1991 | European Pat. Off. . |
| 0462560A1 | 12/1991 | European Pat. Off. . |
| 62-50811 | 3/1987 | Japan . |
| 62-259296 | 3/1987 | Japan . |
| 61-30833 | 8/1987 | Japan . |

OTHER PUBLICATIONS

Communication dated Sep. 6, 1994.
EPO Search Report 91110169.3.

*Primary Examiner*—S. Rosasco
*Attorney, Agent, or Firm*—Ratner & Prestia

[57] ABSTRACT

A photomask used by photolithography and a process for producing same which allows a single exposure to make a photomask, thereby simplifying the photomask making process, and facilitating the inspection and correction of photomasks. In addition, the phase shifter using a slanting pattern prevents a pattern from being formed outside a predetermined area. The use of a phase shifter which does not resolve under an optical projection system shields a large size area against an irradiated light, thereby allowing the formation of fine, intricate patterns suitable for use in LSIs.

15 Claims, 26 Drawing Sheets

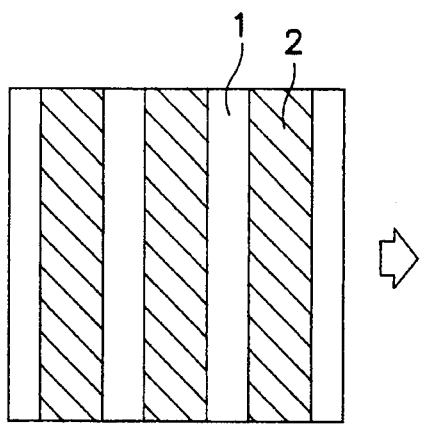
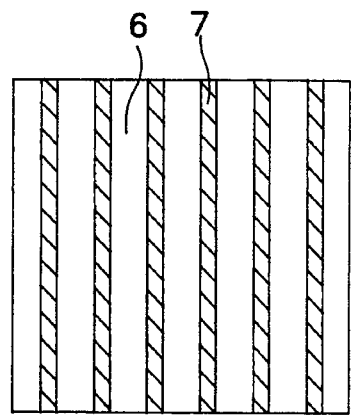
FIG. 14(a)     FIG. 14(b)
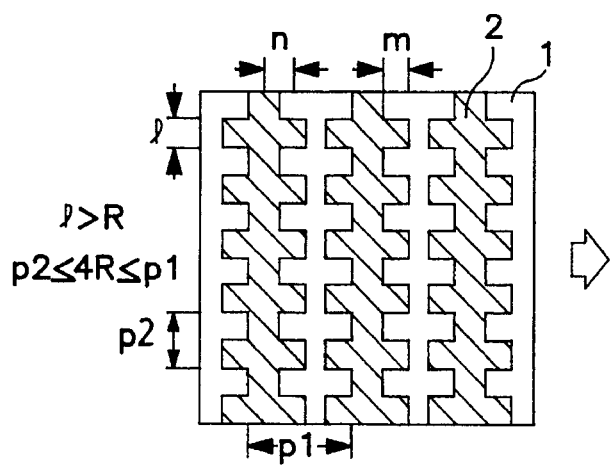
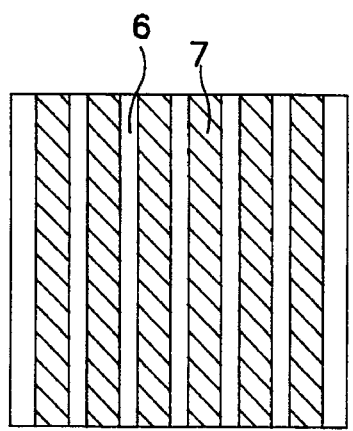
FIG. 14(c)     FIG. 14(d)
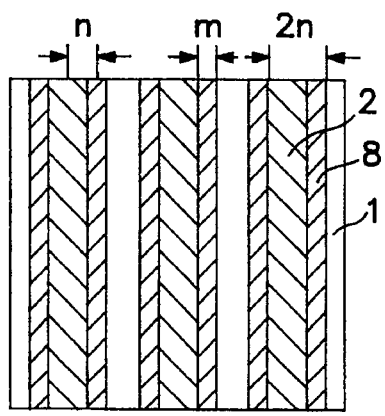
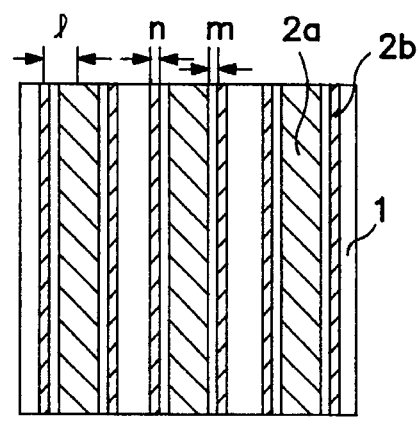
FIG. 14(e)     FIG. 14(f)

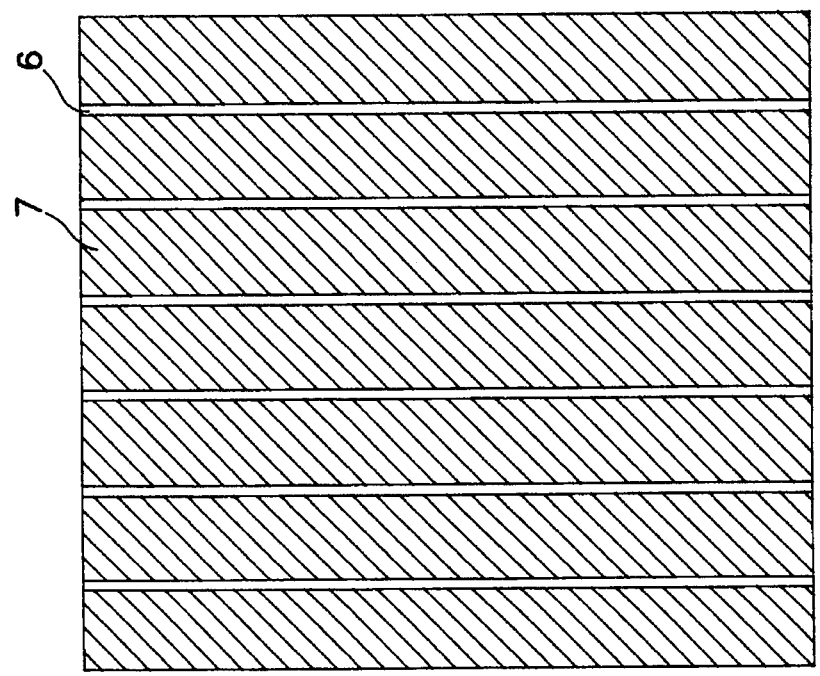
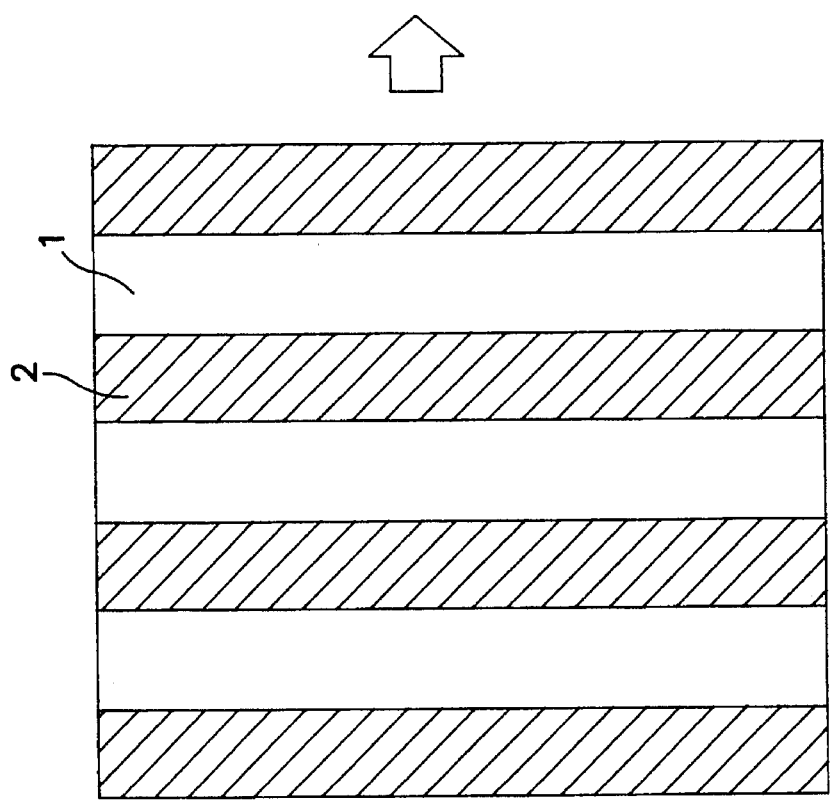
FIG. 22(a)
FIG. 22(b)

PHOTOMASK USED BY PHOTOLITHOGRAPHY AND A PROCESS OF PRODUCING SAME

This application is a continuation of application Ser. No. 07/718,337 filed Jun. 19, 1991, now abandoned.

BACKGROUND OF THE INVENTION

1. Field of the Invention

The present invention relates to a photomask used by photolithography, and a process for making same.

2. Description of the Prior Art

In recent years, semiconductor technology has made remarkable progress. In line with this progress, highly intricate patterns have been required for sophisticated semiconductor devices, such as LSIs. The formation of intricate or highly fine patterns is entirely due to the recent development of lithography.

Lithography consists of a process in which a resist is first coated, then exposed to light and developed with a developer. The fineness of the resulting patterns has been improved by the development of the material of the resist, the device and method of exposure.

There are proposals for reducing the size of patterns, which, for example, are disclosed in Japanese Patent Publication No. 62-50811 and No. 62-59296. The feature common to these proposals is that a photomask used for exposing radiation is improved so that a phase difference arises in the irradiated light or incident light upon the photomask through an optical system, thereby achieving fine, intricate patterns.

Referring to FIGS. 26 and 27, the known photomask will be described in greater detail:

A photomask substrate 1 is prepared, and a light-shielding layer 2 is formed thereon so as to give a circuit pattern to be transferred. Transparent or transmissive layers 3 are provided on either side of the light-shielding layer 2. One of them acts as a phase shifter. The phase shifter is to change the phase of an exposing radiation.

In FIG. 27, the substrate 1 is composed of two different members 4 and 5 arranged side by side, of which the members 4 are transparent or transmissive layer. The members 4 act as phase shifters. This example is characteristic in that the phase shifter 4 is not formed on the substrate 1. This type of photomask is disclosed in Japanese Laid-Open Patent Publication No. 62-92438.

These prior art photomasks have the following disadvantages:

In the photomask shown in FIG. 26 the light-shielding pattern is formed in a conventional photomask making process; more specifically, a substrate is wholly covered with a thin layer so as to form a light-shielding layer pattern. This thin layer is made of chromium layer or molybdic silicide layer. The thin layer is then coated with a resist, and baked. Then a desired area is exposed to light or electron beams. The resist in the exposed area is removed or remain by using an appropriate developer so as to form a resist pattern. Finally, a liquid or gaseous etchant is used, called wet etching or dry etching, to etch the thin layer into a light-shielding pattern.

Then, a phase shifter 4 of a thin film is formed on the light-shielding pattern and a transparent area outside the light-shielding area. The thin layer is made of photosensitive resin. Light or electron beams are radiated on a desired area in the thin layer. It is necessary to align the exposing radiation with the edges of the light-shielding patterns. This means two times of exposure, thereby resulting in a complicated exposing procedure. In addition, the alignment must be strictly accurate, otherwise a desired phase shifter will not be attained.

In general, a photomask must be perfect, free from any defects. However, it is difficult to detect any fault in the photomask by scanning light so as to find a scattering light or a permeating light. This detecting method is likely to be inaccurate because of an out-of-focus irradiation caused by the uneven thickness of the phase shifter due to the presence of the light-shielding layer, and because of the impermeability of light in the overlapping of the light-shielding layer over the phase shifter. In this case it is necessary to produce another phase shifter so as to remedy the defects.

In the phase shifter shown in FIG. 27 the phase shifters are arranged at equal intervals. In order to achieve a desired phase difference, it is necessary to fabricate the intervals to a high precision, thereby resulting in a difficult fabrication of photomasks. Irregular intervals cannot produce fine, intricate patterns suitable for IDs used in LSIs.

SUMMARY OF THE INVENTION

The photomask of this invention, which overcomes the above-discussed and numerous other disadvantages and deficiencies of the prior art, comprises a transparent substrate, and a transparent layer pattern formed on the transparent substrate, the transparent layer pattern giving a phase difference to an incident light.

Alternatively, the photomask comprises a transparent substrate, and a transparent layer pattern formed on the transparent substrate, wherein the following relationship is established:

$$t=\lambda/2(n-1)$$

where t is a thickness of the transparent layer pattern, $\lambda$ is a wavelength of an incident light, and n is an index of refraction.

Alternatively, the photomask comprises a transparent substrate, and a transparent layer pattern formed on the transparent substrate, the transparent layer pattern giving a phase difference of 180° multiplied by an odd number to an incident light.

Alternatively, the photomask comprises a transparent substrate, and a transparent layer pattern formed on the transparent substrate, the transparent layer pattern giving a phase difference to an incident light, wherein the intensity of an incident light is minimized at an edge of the transparent layer pattern.

Alternatively, the photomask comprises a transparent substrate, and a transparent layer pattern formed on the transparent substrate, the transparent layer pattern giving a phase difference of 180° multiplied by an odd number to an incident light, wherein the following equation is established:

$$R=k_1 \cdot \lambda/NA$$

where R is a limit for the resolution of an optical resist patter, $k_1$ is a constant having a value of about 0.35, $\lambda$ is a wavelength of an incident light, and NA is a numerical aperture of an optical lens.

Alternatively, the photomask comprises a transparent substrate, and a transparent layer pattern formed on the transparent substrate, and an area which is shielded from light by the transparent layer.

Alternatively, the photomask comprises a transparent substrate, and a transparent layer pattern formed on the transparent substrate, and an area which is shielded from light by the transparent layer, the shielded area being formed by a pattern having a pitch below the optical resolution limit.

Alternatively, the photomask comprises a transparent substrate, and a transparent layer pattern formed on the transparent substrate, and an area which is shielded from light by the transparent layer, the shielded area comprising a repetition of patterns having a pitch below a resolution limit.

Alternatively, the photomask comprises a transparent substrate, and a transparent layer pattern formed on the transparent substrate, and an area which is shielded from light by the transparent layer, the shielded area comprising a repetition of patterns having a pitch below a resolution limit, wherein the following equation is established:

$$R=k_1 \cdot \lambda / NA$$

where R is a limit for the resolution of an optical resist pattern $k_1$ is a constant, $\lambda$ is a wavelength of an incident light, NA is a numerical aperture of an optical lens.

Alternatively, the photomask comprises a transparent substrate, and a transparent layer pattern formed on the transparent substrate, and an area which is shielded from light by a repetition of patterns having a pitch of not larger than four times the value of R.

Alternatively, the photomask comprises a transparent substrate, and a transparent layer pattern formed on the transparent substrate, and an area which is shielded from light by the transparent layer, the area occupying not larger than 10% of light intensity.

Alternatively, the photomask comprises a transparent substrate, and a repetition of transparent layer pattern formed on the transparent substrate, the pattern having a pitch below a resolution limit which gives a phase difference to an incident light, and the pattern having light intensity in a zigzag form.

Alternatively, the photomask comprises a transparent substrate, and a repetition of transparent layer pattern formed on the transparent substrate so as to give a phase difference to an incident light, wherein the pattern is repeated at a pitch in the range of 1.0 µm to 4.0 µm.

Alternatively, the photomask comprises a transparent substrate, and a transparent layer pattern formed on the transparent substrate, the pattern comprising a repetition of line and space.

Alternatively, the photomask comprises a transparent substrate, and a transparent layer pattern formed on the transparent substrate, the pattern comprising a matrix arrangement.

Alternatively, the photomask comprises a transparent substrate, and a transparent layer pattern formed on the transparent substrate, the pattern giving a phase difference to an incident light so as to form a single resist pattern.

Alternatively, the photomask comprises a transparent substrate, and a transparent layer pattern formed on the transparent substrate so as to give a phase difference to an incident light, the pattern comprising a light-shielding part of a repetition of pattern having a pitch below a resolution limit, and a transparent part of a repetition of pattern having a pitch above the resolution limit.

Alternatively, the photomask comprises a transparent substrate, and a first transparent layer pattern forming a first resist pattern, and a second transparent layer pattern formed reversely to the first transparent layer forming a second resist pattern, the first and second resist pattern being identical in shape.

Alternatively, the photomask comprises a transparent substrate, and a transparent layer pattern formed on the transparent substrate so as to give a phase difference to an incident light, the transparent layer pattern comprising part of the periphery thereof slanting in the cross-section.

In a preferred embodiment, the transparent layer pattern comprises a slanting side thinning step by step.

In a preferred embodiment, the transparent layer pattern comprises a slanting side thinning continuously.

Alternatively, the photomask comprises a transparent substrate, and a transparent layer pattern formed on the transparent substrate so as to give a phase difference to an incident light, the transparent layer pattern comprising a repetition of projections having a pitch below a resolution limit.

In a preferred embodiment, the lengths of the projections determines the widths of the resist pattern.

Alternatively, the photomask comprises a transparent substrate, and a transparent layer pattern formed on the transparent substrate so as to give a phase difference to an incident light, the transparent layer pattern having both ends slanting in the cross-section thereof.

In a preferred embodiment, the width of the slanting transparent pattern controls the width of the widths of the resist pattern.

Alternatively, the photomask comprises a transparent substrate, and a first transparent layer pattern formed on the transparent substrate so as to give a phase difference to an incident light, and a second transparent pattern formed on both sides of the first transparent pattern, the second transparent pattern having a pitch below a resolution limit.

In a preferred embodiment, the photomask is formed within a space constituted by a plurality of a pitch of the second transparent layer pattern.

In a preferred embodiment, the widths of resist patterns are controlled by the width of an area in which the second transparent layer pattern.

Alternatively, the photomask comprises a transparent substrate, and a transparent layer pattern formed on the transparent substrate so as to give a phase difference to an incident light, the transparent pattern comprising a repetition of pattern having a pitch below an optical phase difference, and part of the periphery thereof having a slanting side in the cross-section.

Alternatively, the photomask comprises a transparent substrate, and a transparent layer formed on the substrate, the transparent layer containing a silicon-base resist pattern formed on the transparent substrate, the resist pattern containing siloxane polymer, and giving a phase difference of 180° multiplied by an odd number to the incident light.

According to another aspect of the present invention, there is a process for forming a photomask, the process comprises the steps of coating a transparent substrate with a transparent layer to a sufficient thickness to give a phase difference of 180° multiplied by an odd number to the incident light, and forming a transparent pattern by exposure to light.

Alternatively, the process for forming a photomask, the process comprises the steps of depositing a transparent layer on a transparent substrate to a sufficient thickness to give a phase difference of 180° multiplied by an odd number to an incident light, coating the transparent layer with a resist, forming a resist pattern by exposure to light, and removing the transparent layer by the use of the resist pattern as a mask.

Alternatively, the process for forming a photomask, the process comprises the steps of forming a resist pattern on a transparent substrate, depositing a transparent layer on the transparent substrate to a sufficient thickness to give a phase difference of 180° multiplied by an odd number to the incident light, removing the transparent layer by removing the resist pattern so as to enable a transparent pattern to remain on the substrate.

Alternatively, the process for forming a photomask, the process comprises the steps of depositing a transparent layer on a transparent substrate to a sufficient thickness to give a phase difference of 180° multiplied by an odd number to the incident light, coating the transparent layer with a resist, and exposing the resist to light by changing the amount of exposure.

Alternatively, the process for forming a photomask, the process comprises the steps of depositing a transparent layer on a transparent substrate to a sufficient thickness to give a phase difference of 180° multiplied by an odd number to the incident light, coating the transparent layer with a resist, and effecting the exposure of part of the periphery of the resist by a light whose focus is deviated.

Thus, the invention described herein makes possible the objectives of (1) providing a photomask which simplifies the process of fabricating photomasks by reducing the number of exposures to one time, and eliminating the necessity of aligning the mask with a light-shielding layer, (2) providing a photomask which facilitates the inspection and correction of photomasks, (3) providing a photomask which enables the formation of highly fine, intricate patterns required for ICs of LSIs, and (4) providing a process for producing such photomasks.

BRIEF DESCRIPTION OF THE DRAWINGS

This invention may be better understood and its numerous objects and advantages will become apparent to those skilled in the art by reference to the accompanying drawings as follows:

FIG. 14 (a) to (f) are plan views showing various widths of resist patterns achieved by the photomask;

FIGS. 22(a) and 22(b) are plan views showing the shape of a phase shifter achieved when the photomask is applied to a semiconductor substrate;

DESCRIPTION OF THE PREFERRED EMBODIMENTS

Figure 1A:
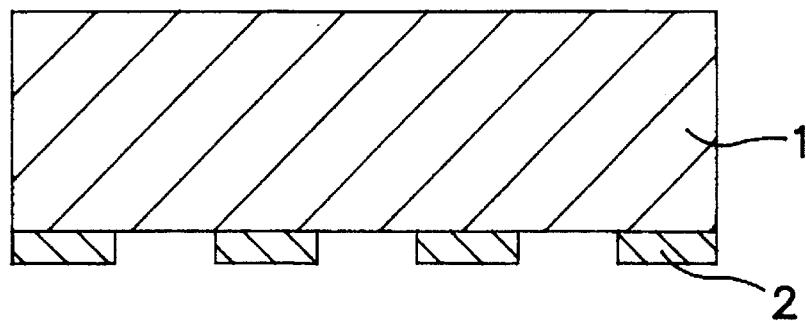
FIGS. 1 (a) and 1 (c) are diagrammatical cross-sections showing a photomask according to the present invention, and FIG. 1 (b) is a graph showing the distribution of light intensity.
Figure 1B:
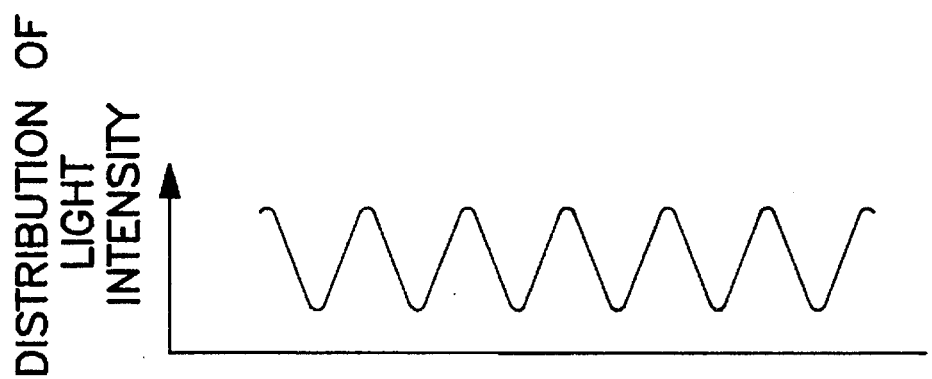

Referring to FIG. 1, a light transparent photomask substrate 1, hereinafter referred to merely as "substrate 1" is provided with a phase shifter 2 which is formed by patterning a transparent layer. No light-shielding pattern is formed unlike the conventional photomasks. Hereinafter, the substrate 1 and the phase shifter 2 in combination are called the "transparent phase-shifter mask". FIG. 1(b) shows the distribution of the intensity of a light passing through the photomask when the latter is irradiated with a light. The "transparent phase-shifter mask" is intended to give a phase shift between the light passing through the pattern of the phase shifter 2 and the light passing through the substrate 1.

The light passing through the phase shifter 2 is shifted in an angular range from 90° to 270°. The phase difference can be adjusted by selecting an appropriate thickness of the phase shifter 2. Preferably, the layer is thick enough so as to ensure that the phase difference is 180° ($\pi$).

When a transparent phase-shifter mask having a phase difference of 180° is exposed to light, a light passing through the phase shifter 2 and a light passing through the substrate 1 have a phase difference of 180° to each other, wherein the lights have no substantial phase difference (i.e. coherent lights). When coherent lights are introduced through different portions, they interact with each other. This interaction affects the light width. If the phase difference is zero, which means that coherent lights passing through the space are mutually in conflict, they strengthen each other. As a result, the sum of the widths of the two lights causes an interference. In the transparent phase-shifter mask a light passing through the substrate 1 and the phase shifter 2 have a phase difference of 180°. As a result, the two lights cause an interference so as to weaken each other. A light passing through both ends of the phase shifter 2 causes an interference with a light passing through an adjacent substrate 1 because of their mutual phase differences being different by 180° so that the mutual light intensities are weakened. In other words, the intensity of light is minimized because of the interference caused by the edges of the phase shifter 2.

Figure 1C:
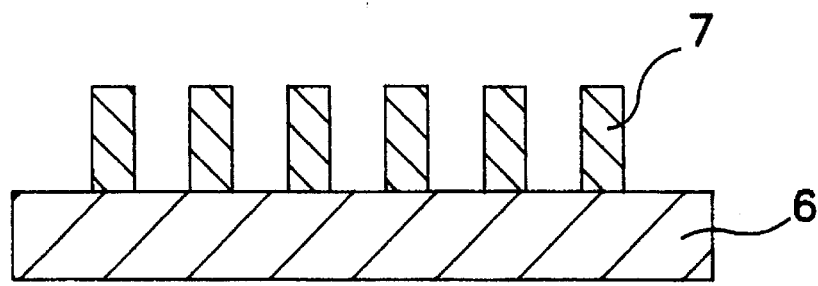

FIG. 1(c) shows an example of forming a positive resist pattern by the use of a photomask according to the present invention.

A semiconductor substrate 6 is prepared, on which a resist is coated to a thickness of 0.5 microns, and the coat is pre-baked so as to harden the resist. The hardened resist is exposed to an irradiation having the intensity shown in FIG. 1(b). The exposed portions are removed so as to form a resist pattern 7 with a developer.

The light intensity is minimized by every edge of the phase shifter 2. As a result, the number of the resist patterns 7 formed on the semiconductor substrate 6 amounts to two times the number of those formed on the substrate 1. It will be understood from this that resolving power is enhanced as compared with the known exposing technique utilizing no phase difference.

FIG. 2 shows an example of forming a single pattern (hereinafter called "single pattern") as a phase shifter 2. FIG. 2(a) is a sectional view showing a transparent phase-shifter mask according to the present invention:

The transparent phase-shifter mask is also made of the substrate 1 and the phase shifter 2, having no light-shielding layer.

The single pattern is formed at a sufficient distance from other patterns formed on the substrate 1. Another pattern is also shown which is free from an adverse influence when a resist pattern is formed, even if the light is interfered by a light passing through other patterns on the substrate 1.

As described with respect to FIG. 1, the lights passing through the phase shifter 2 and the substrate 1 have a phase difference. Two lights passing through the edges of the phase shifter 2 have a phase difference of 180°, thereby causing an interference which weakens the intensity.

Figure 2A:
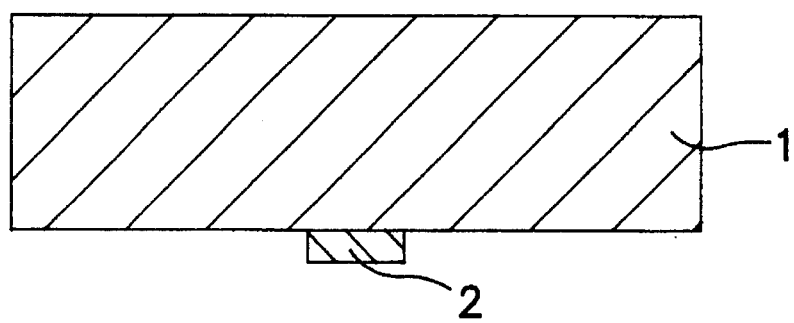
FIG. 2 (a) and 2 (c) are diagrammatical cross-section showing a photomask according to the present invention, and FIG. 2 (b) is a graph showing the distribution of light intensity.
Figure 2B:
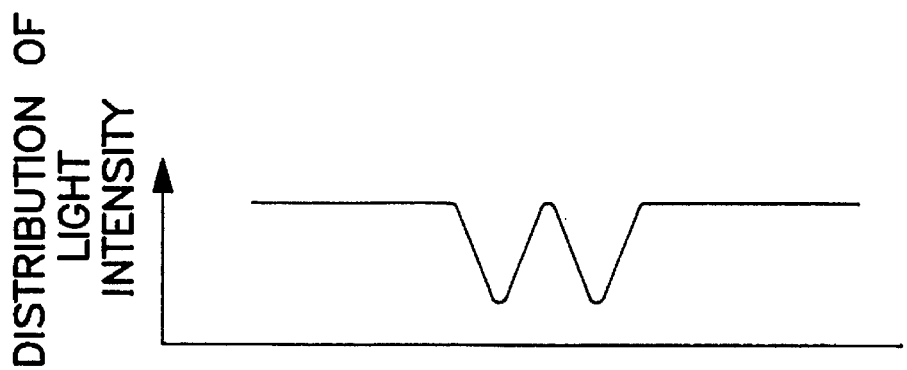
Figure 2C:
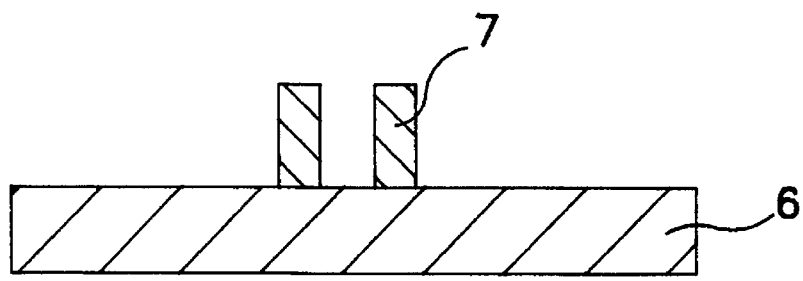

As shown in FIG. 2(b), the distribution of light intensity on a wafer is minimized at the edges of the pattern. When this transparent phase-shifter is used to form a positive resist pattern, the resist pattern 7 takes the form shown in FIG. 2(c). In the case of a single pattern formed with a light-shielding layer, the area covered with the light-shielding layer remains as a resist pattern.

The transparent phase-shifter mask has no distinct areas of white (an area through which a light passes) and of black (the area to which a light is shielded). The transparent phase-shifter mask allows a light passing through the substrate 1 to pass through, and a light passing through the phase shifter 2 to pass through. The present invention requires a light-shielding layer but utilizes the intensity of light varying owing to interference.

FIG. 3 shows shapes of a phase shifter 2 formed on the substrate 1. When the single square pattern shown in FIGS. 3(a) and 3(b) is used, the resulting positive resist pattern takes the form shown in FIG. 3(c).

Figure 3A:
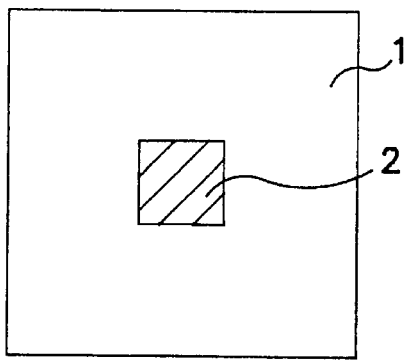
FIGS. 3 (a) to (f) are plan views showing various shapes of the photomask according to the present invention.
Figure 3D:
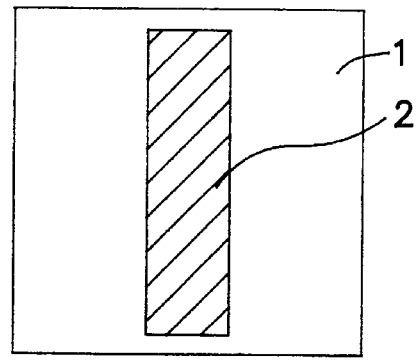
Figure 3B:
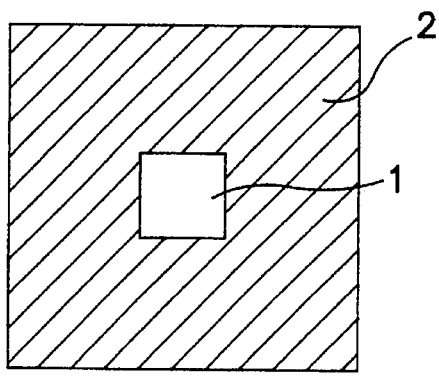

FIG. 3(a) shows a square area given by the phase shifter 2, and FIG. 3(b) shows a larger area given by the phase shifter 2. By using either mask, the same resist pattern 7 is formed as shown in FIG. 3(c) by irradiating a laser beam upon the semiconductor substrate 6. In the transparent phase-shifter mask the resist pattern is formed at an area where the phases of the irradiated light differ by 180°. The intensity of light is reduced at this area, and after development, the resist around this area remains. For these reasons, in the transparent phase-shifter mask of FIGS. 3(a) and 3(b), the edge portion of the square phase shifter 2, and other edge portions than the square phase-shifter correspond to the area where the phases are displaced by 180°. Thus, in each transparent phase-shifter mask the same shape of resist patterns 7 are formed.

Figure 3E:
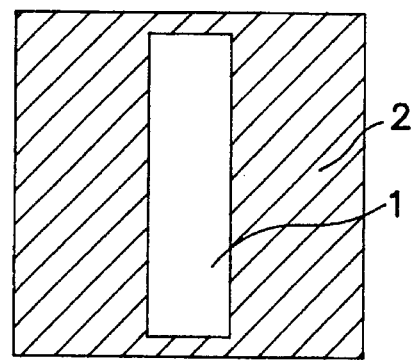
Figure 3C:
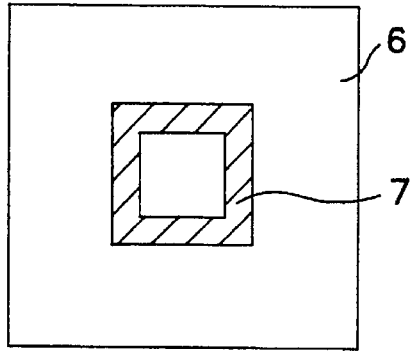
Figure 3F:
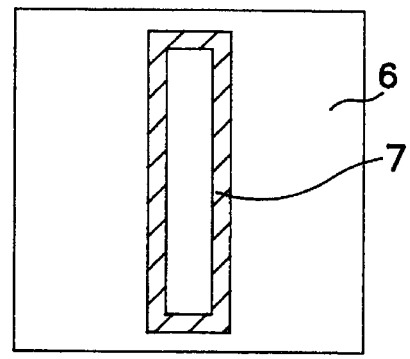

When exposure is made by the use of a single rectangular pattern as shown in FIGS. 3(d) and 3(e), the positive resist pattern shown in FIG. 3(f) is formed.

FIG. 3(d) shows an area formed by a rectangular phase shifter 2 on the substrate 1 and FIG. 3(e) shows an area other than the rectangular portion which is formed by the phase shifter 2.

Both of these show the same resist pattern 7 as shown in FIG. 3(f). This will be understood from the same explanation given with respect to FIGS. 3(a) and 3(b).

More specifically, in transparent phase-shifter mask an area where the phase of a light is different by 180° has a least light intensity, and allows a resist around this area to remain after development. For this reason, in the transparent phase-shifter mask of FIGS. 3(d) and 3(e) this area corresponds to the edge portions of the rectangular phase shifter 2, and in FIG. 3(e) the area corresponds to the edge portions of other than the rectangular phase shifter 2. As a result, in each transparent phase-shifter mask the same resist pattern 7 is formed.

The fine pattern shown in FIG. 3 (c) is difficult to fabricate by the use of a photomask in common use or a conventional phase shifter mask. That is, if in photomasks made from a conventional light-shielding layer a resist pattern 7 to be formed is rectangular or square, the light-shielding layer must be correspondingly rectangular or square. In this case, electron beams are used to pattern the resist coated on the light-shielding layer. However, a problem arises in that when the rectangular shape to be formed is extremely fine, the area of exposure is likely to expand owing to scattering of electron beams. As a result, the four corners of both rectangles are rounded. When a much finer pattern is to be formed, the square of the resist pattern 7 becomes rounded.

When a photomask formed with a rectangular light-shielding layer by the use of electron beams is used to form a resist pattern, the desired area is exposed to light by diffraction through the edges of the shielding layer; more specifically, the corners of the square of the resist pattern 7 are rounded or the square remains.

Even in the conventional phase-shifter mask the same problem arises because the light-shielding layer is formed and a phase shifter is formed in the edge portion. In contrast, in transparent phase-shifter mask a phase shifter a resist pattern can be formed in a desired shape.

A resist pattern 7 formed by the use of a transparent phase-shifter mask is formed along the periphery of a pattern of the phase shifter 2. This shapes the phase shifter 2 like an closed ring or alternatively a slightly modified shape. With the use of such shapes of resist patterns 7 alone it is difficult to fabricate intricate patterns such as LSIs, and it is required to prepare various shapes other than the closed ring shape.

In order to meet such demands, another example has been provided, which is characterized by the phase shifter which diminishes in thickness continuously or step by step. Hereinafter, this type of phase shifter is called a multi-stage phase shifter, which will be described in detail:

Referring to FIG. 4, the photomask comprises a transparent photomask substrate 1, hereinafter called "substrate", and a phase shifter 2 made of a transparent layer, having no light-shield pattern unlike the conventional photomasks.

The phase shifter 2 includes a multi-stage phase shifter 8 which has a left-hand wall constantly upright to the main surface of the substrate 1 and has a right-hand wall gradually changeable in thickness.

Figure 4A:
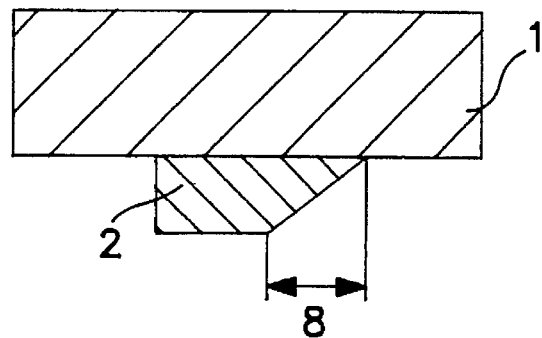
FIGS. 4 (a) to (c) are cross-sectional views showing various shapes of multi-stage phase shifters of the photomask according to the present invention.
Figure 4B:
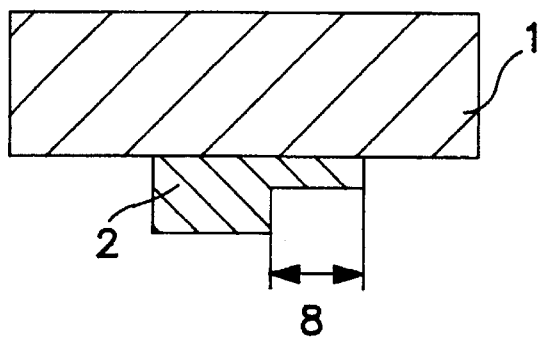
Figure 4C:
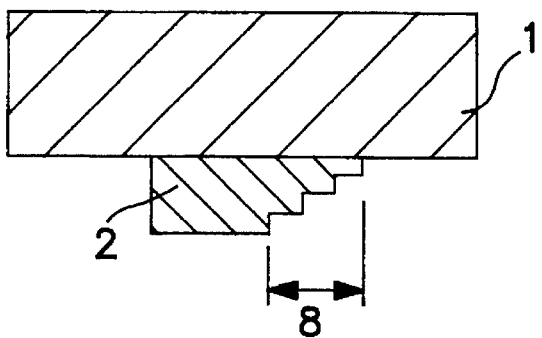

FIG. 4(a) shows the multi-stage phase shifter portion 8 whose one side diminishes toward its end, and FIG. 4(b) shows the phase-shifter whose one side diminishes in thickness step by step; in the illustrated embodiment, the thickness in the step diminishes by ½ of the entire thickness. FIG. 4(c) shows other multi-stage phase shifter 8 whose one side has three steps, diminishing in thickness by ¼ of the entire thickness.

The phase of an incident light is 180° at the left end of the phase shifter 2, and makes a phase difference of 180° from the phase of an incident light to an area having no phase shifter. The incident light to the right end of the multi-stage phase shifter 8 has a phase difference varying from 180° to 0° (zero) continuously. In FIG. 3(b) the phase difference of light is 180° in the phase shifter 2, 90° in the multi-stage phase shifter 8, and 0° in the photomask.

FIG. 4 (c) shows an intermediate mode between those of FIGS. 4 (a) and 4 (b), in which the phase difference of the incident light varies from 180° to 0° step by step.

Figure 5A:
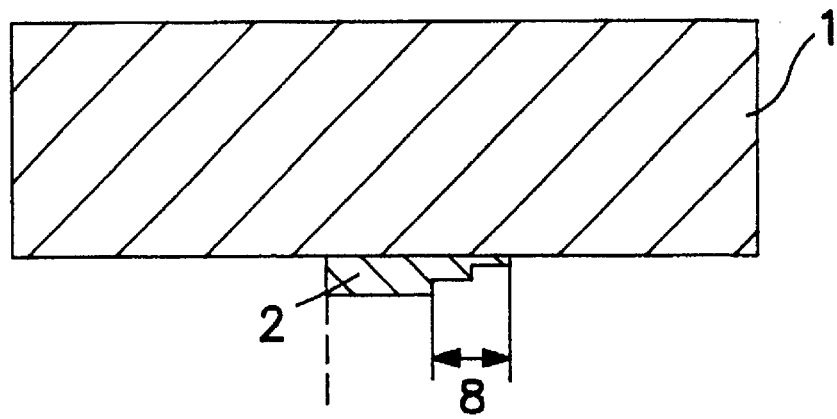
FIGS. 5 (a) and 5 (c) are diagrammatical cross-section showing a photomask having a multi-stage phase shifter, and FIG. 5 (b) is a graph showing the distribution of light intensity.
Figure 5B:
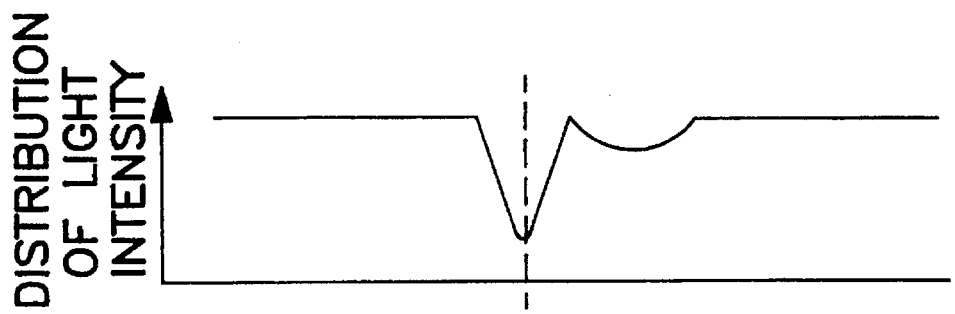
Figure 5C:
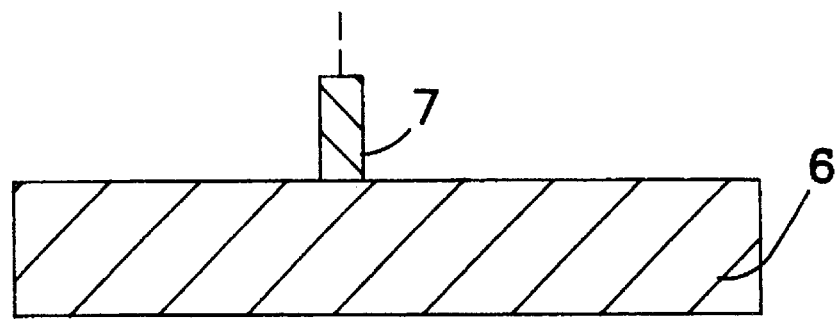

FIG. 5 shows a sectional structure of transparent phase-shifter mask having a multi-stage phase shifter, and an exposure theory.

FIG. 5 (a) shows a multi-stage phase shifter 8 having two steps which diminishes by ⅓ of the entire thickness step by step. In this phase shifter 2 the phase difference of light is 180° in the phase shifter 2, diminishes to 120° or to 60° in the multi-stage phase shifter 8, and to 0° in the multi-stage phase shifter.

FIG. 5 (b) shows the distribution of the intensity of light passing through the mask when it is irradiated with the use of a transparent phase-shifter mask having this type of multi-stage phase shifter 8.

The radiated light has a phase difference of 180° at the left end portion of the phase shifter 2, and its intensity is remarkably reduced. In the multi-stage phase shifter 8 the phase difference gradually diminishes, and the reduction of light intensity due to interference is minimized. Thus, when such a transparent phase-shifter mask is used to form a positive resist pattern, a single resist pattern is formed as shown in FIG. 5 (c).

Figure 6A:
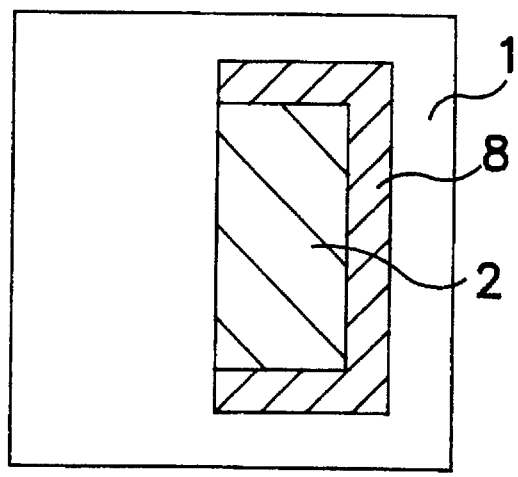
FIGS. 6 (a) and 6 (b) are plan views showing a photomask having a multi-stage phase shifters.
Figure 6B:
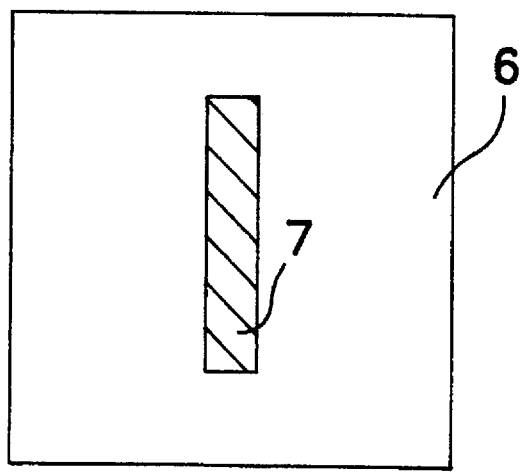
Figure 7A:
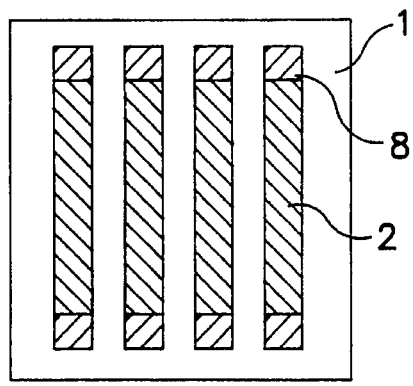
FIGS. 7 (a) to (e) are plan views showing a photomask having other forms of multi-stage phase shifters.
Figure 7B:
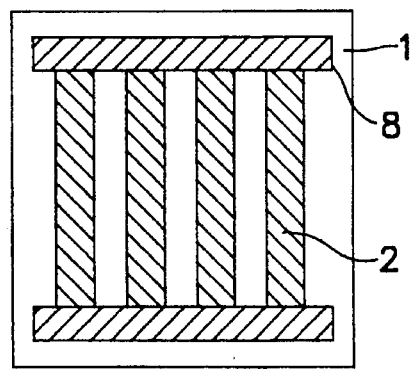
Figure 7C:
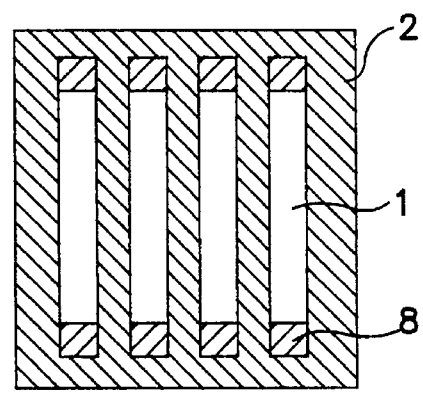
Figure 7D:
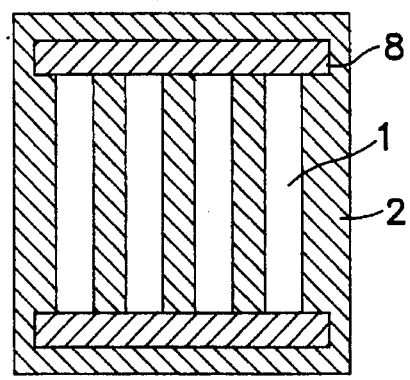
Figure 7E:
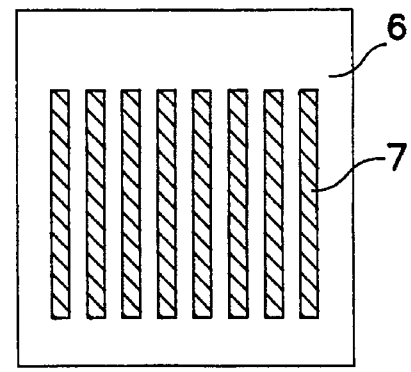

FIG. 6 shows the shape of a phase shifter formed on the main surface of the substrate 1, and a resist pattern formed on a semiconductor substrate.

FIG. 6 (a) shows a rectangular phase shifter having a multi-stage phase shifter. This type of transparent phase-shifter mask has a phase shifter which gives a phase difference of 180° to the substrate 1. The phase shifter 2 has a rectangular shape, and forms a rectangular shape of resist pattern as shown in FIG. 3. The phase shifter includes a phase shifter 2 and a multi-stage phase shifter 8. This multi-stage phase shifter 8 is provided by the edges corresponding to the phase shifter 2 that does not form a desired resist pattern. This multi-stage phase shifter 8 is formed along the three edges of the phase shifter 2, and the light intensity in the area enclosed by the multi-stage phase shifters 8 is least reduced, thereby forming no pattern.

FIG. 6 (b) shows a positive resist pattern formed by the use of this type of transparent phase-shifter mask.

In this way the single resist pattern 7 is formed. If this single resist is to be formed by the use of a conventional photomask, the light will be diffused to area other than a predetermined one under the influence of diffraction. This prevents the resist pattern 7 from being formed in a desired form.

The conventional phase shifter mask is suitable for fabricating repeated patterns but not suitable for fabricating a single pattern. In contrast, the use of a transparent phase shifter mask enables a single resist pattern to be fabricated easily. In addition, a multi-stage phase shifter can be used which changes the phase continuously or step by step, thereby allowing the resist patterns to be formed at various places.

FIGS. 7 (a) to (d) shows the phase shift pattern of a photomask according to the present invention when it is used to form a resist pattern for a line-and-space.

FIG. 7 (a) shows a phase shifter 2 which gives a phase difference of 180° to the transparent substrate 1. The phase shifter 2 is generally rectangular, which forms a rectangular resist pattern as shown in FIG. 3. In order to form single patterns, the phase shifter includes a phase shifter 2 and a multi-stage phase shifter 8. In order to make a line and space have a line and space, the resist pattern, the multi-stage phase shifter 8 is provided at the top portion of the phase shifter 2.

In order to change the width of the space in the line and space, the widths of a plurality of phase shifters 2 and the widths of a space existing between the phase shifters 2 can be changed.

FIG. 7 (b) shows a phase shifter 2 which gives a phase difference of 180° to a transparent photomask substrate 1. This phase shifter 2 is generally rectangular, which forms a rectangular resist pattern as shown in FIG. 3. In order to form a plurality of single patterns, the phase shifter includes the phase shifter 2 and a multi-stage shifter 8. In order to make the resist pattern have a line and space, the multi-stage phase shifter 8 is provided at the top portion of the phase shifter 2.

In order to change the widths of a line and space of a resulting resist pattern, the widths of a plurality of phase shifters 2 and the width of an area existing between the phase shifters 2.

FIG. 7 (c) shows a reversed structure in which the phase shifter 2 and the photomask substrate 1 shown in FIG. 7 (a) are turned upside down as shown in FIG. 3. This structure enables the resist pattern to be formed in an identical shape to that of FIG. 7 (a).

Likewise, FIG. 7 (d) shows a reversed structure in which the phase shifter 2 and the photo-mask substrate 1 shown in FIG. 7 (b) are turned upside down as shown in FIG. 3. This structure enables the resist pattern to be formed in an identical shape to that of FIG. 7 (b).

FIG. 7 (e) shows a resist pattern 7 formed by radiating light by the use of a transparent phase-shifter mask.

Figure 8A:
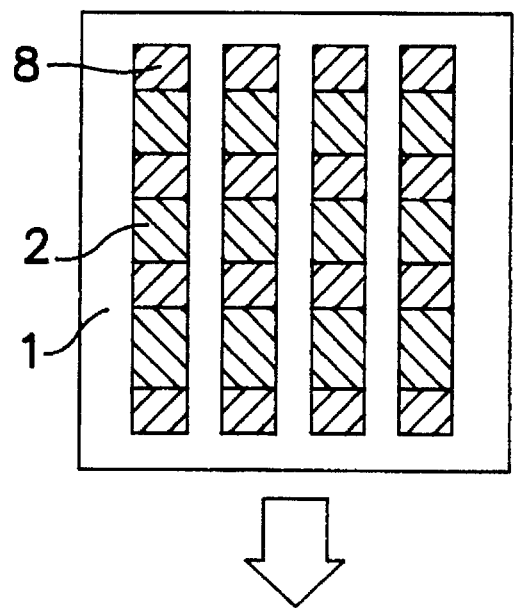
FIGS. 8 (a) and 8 (b) are plan views showing a photomask having other forms of multi-stage phase shifters.

FIG. 8 shows a photomask and a resist pattern used for forming a line pattern in a matrix. FIG. 8 (a) shows a phase shifter 2 which gives a phase difference of 180° to the transparent substrate 1. The phase shifter 2 is generally rectangular, which forms a rectangular resist pattern as shown in FIG. 3. In order to form a plurality of resist patterns in a matrix, the phase shifter includes the phase shifter 2 and a multi-stags phase shifter 8, wherein in addition to the phase shifter 2 and the multi-stage phase shifter 8, a further multi-stage phase shifter 8 is provided in a predetermined area in the phase shifter 2.

Figure 8B:
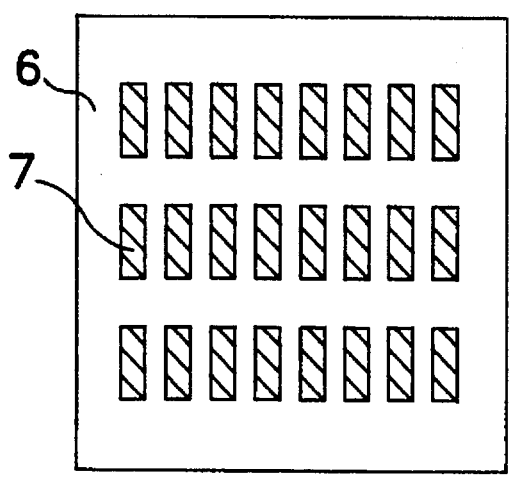

In this way the resist pattern in a matrix is formed as shown in FIG. 8(b). If the lateral width of the line pattern is to be changed, it is possible to change the lateral width of the plurality of phase shifters 2 and the area existing between the phase shifters 2. If the longitudinal width of the line pattern is to be changed, it is possible to change the vertical thickness of the plurality of multi-stage phase shifters 8.

Preferably, the cross-sectional structure is formed as shown in FIG. 4(a) which diminishes in thickness continuously. However, in fabricating a photomask the structure shown in FIG. 4(b), this structure advantageously allows the amount of exposure to be relatively low to such an extent that the thickness of the multi-stage phase shifter 8 be reduced by half when a pattern of the phase shifter 2 is formed by exposure and development.

Figure 9A:
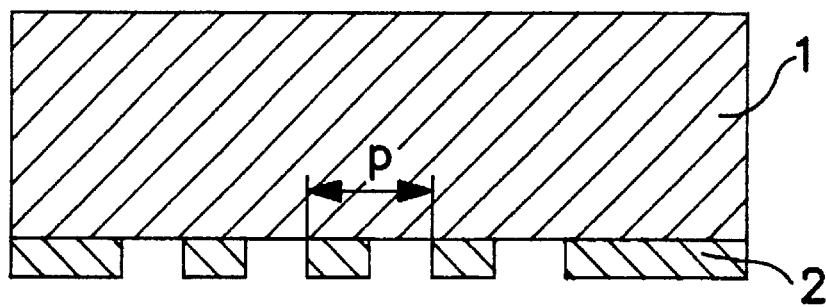
FIGS. 9 (a) and 9 (c) are diagrammatical cross-sections showing a photomask having a multi-stage phase shifter, and FIG. 9 (b) is a graph showing the distribution of light intensity.
Figure 9B:
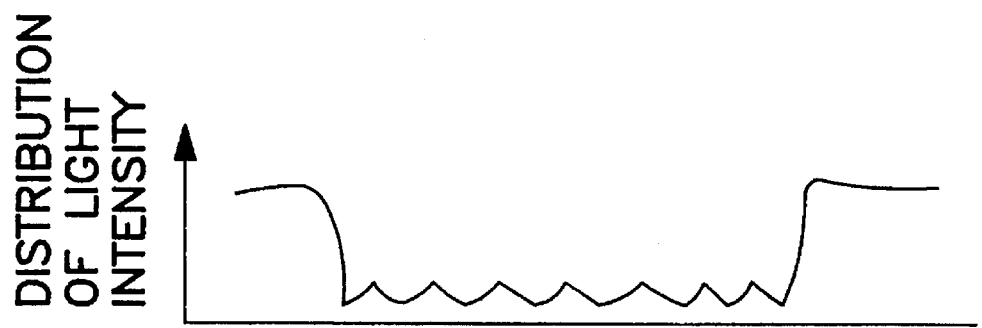
Figure 9C:
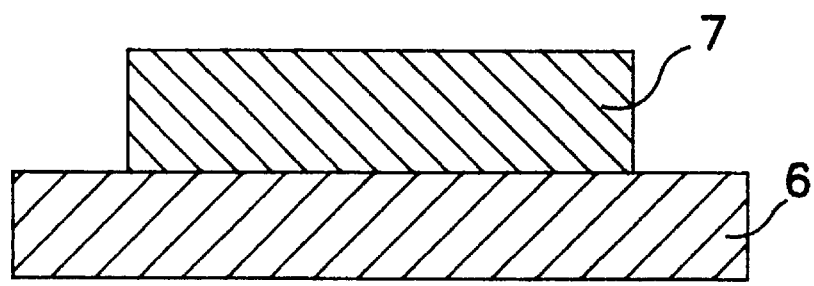

Referring to FIG. 9, a method for fabricating a large-size resist pattern by the use of a transmissive phase-shifter mask;

FIG. 9(a) shows a cross-section of a phase shift mask used for fabricating a large-size resist pattern. A transparent photomask substrate 1, hereinafter called "substrate 1" is provided with a phase shifter 2 which is formed by patterning a transparent layer. No light-shielding pattern is formed unlike the conventional photomasks.

It depends upon the value of the pitch p of a pattern of the phase shifter 2 whether the resist pattern is formed by the use of a phase shifter 2. More specifically, when the pitch p is sufficiently wide, the light through a transparent phase-shifter mask is least intensified at the edge portion of the pattern of a particular phase shifter 2, and the light intensity is most reduced at an edge portion of the phase shifter 2 at edge portions of a phase shifter adjacent to the first phase shifter 2. If an area between the two phase shifters 2 has a light having an intensity above a particular level, a line and space pattern is formed at the time of development. This particular level means a level at which an optical resolving is possible. In this way the repeated pattern is formed as shown in FIG. 1.

If the pitch p is finer than the degree at which optical resolution (hereinafter referred to as "resolution") is possible, the distribution of light intensity on the substrate 1 lacks contrast, thereby failing to form a resist pattern. The lights passing through the pattern of the phase shifter 2 and the substrate 1 interface with each other thereby weakening each other. As a result, the distribution of light will be understood from FIG. 9(b) that at the edge portion of the phase shifter 2 having a wide pitch p, the light is least intensified, and the edge portion of the phase shifter 2 adjacent to the first phase shifter 2 is least intensified. In an area existing between the respective phase shifters the light is intensified, but before it exceeds a predetermined level, the light intensity is reduced by the edges of the phase shifter 2. This process is repeated, and the light is intensified at an area where the pitch p becomes wider than the predetermined width. As is evident from the foregoing, the light intensity in a resist pattern for a wider resist pattern.

FIG. 9(a) shows a resist pattern 7 formed on the semiconductor substrate 6 by the use of this type of transparent phase-shifter mask.

FIG. 10 shows a phase shifter formed on the photomask substrate so as to form a square resist pattern having a large area.

Figure 10A:
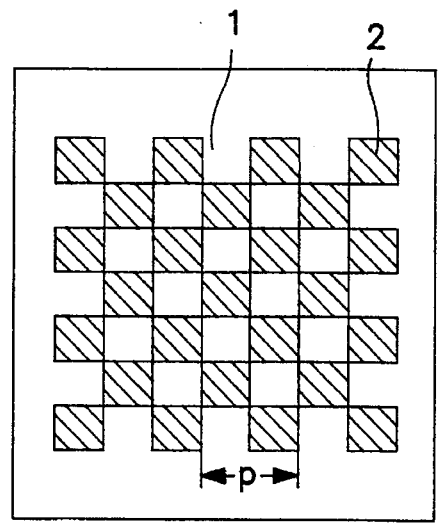
FIGS. 10 (a) to (c) are plan views of a photomask according to the present invention particularly exemplifying the formation of a blackout portion.

FIG. 10(a) shows a transparent phase-shifter mask having a rectangular pattern of a phase shifter 2 square phase shifter 2 arranged in a matrix, wherein the pitch p of the pattern of the phase shifter 2 having a width not exceeding the limit of resolution in an optical exposure system.

Figure 10B:
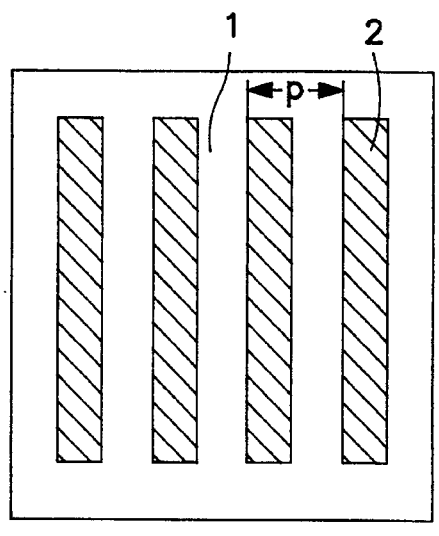

FIG. 10(b) shows a transparent phase-shifter mask having a line-and-space pattern of a phase shifter 2 square phase shifter 2 arranged in a matrix, wherein the pitch p of the pattern of the phase shifter 2 having a width not exceeding the limit of resolution in an optical exposure system.

Figure 10C:
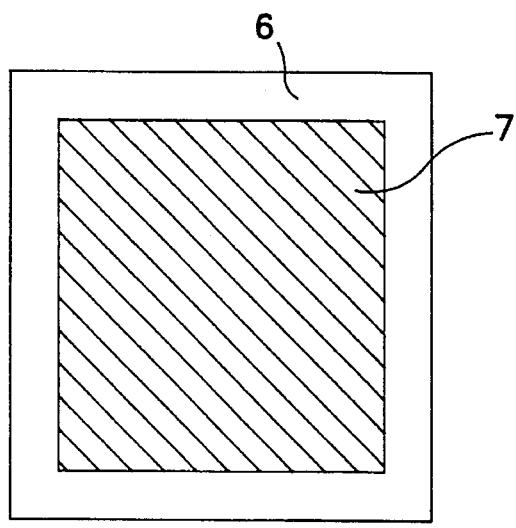

FIG. 10(c) shows a square resist pattern 7 having a large area formed on the semiconductor substrate 6 by exposure and development by the use of a transparent phase-shifter mask.

The resolution of an optical resist pattern has a limit R, which is represented by the following formula:

$$R = k_1 \cdot \lambda / NA \qquad (1)$$

where $k_1$ is a constant, $\lambda$ is a wavelength of light, and NA is a numerical aperture of the optical lens.

When a conventional photomask is used, $k_1$ is 0.5. When a conventional shift mask is used, $k_1$ is 0.35.

Resolution limits R are compared between when a phase shift is used and when a conventional photomask is used, and it is found that the phase shift mask has a resolution limit R reduced 1.4 times that of a conventional photomask, provided that other conditions than the value $k_1$ are the same. As a result, the resulting resist pattern has a reduced width. In this specification "resolution limit" is under an optical projection system unless specified to the contrary.

When a transparent phase-shifter mask according to the present invention was experimentally used, the value of $k_1$ was about 0.35. This is the same value obtained by the use of the conventional phase shift. This is rational in that the underlying theory of irradiation exposure is the same for forming resist patterns between the use of a conventional phase shift and a transparent phase-shifter mask of the present invention. More specifically, when the phase difference is 180° between a light radiated by the edge of the phase shifter and a light radiated upon a photomask substrate, the light intensity is minimized. When this phenomenon is utilized so as to form a resist pattern, the value of $k_1$ (resolution limit R) was about 0.35.

In the transparent phase-shifter mask the edge portion of the phase shifter forms a resist pattern. A number of resist patterns amounts to twice that of the patterns of the phase shifter. The pitch p of the phase shifter patterns calculated from the width of the resist pattern on the semiconductor substrate is R×4.

If the pitch p is above a resolution limit, the resist pattern will be resolved. In order to form a resist pattern for a large-size area, the pitch of a repeated phase shifter pattern must be not larger than four times the value R.

Optically, the smaller this pitch p is, the higher the light-shielding power becomes. This is a desirable phenomenon. However, in the photomask making process an excessively tiny pattern does not favorably affect the results. When i is a source of light at the time of irradiation exposure, NA is 0.45, and a reducing exposing device of 5:1 is employed, the pitch p is preferably in a range of 1.0 to 4.9 μm, wherein the pitch of the resist pattern on the semiconductor substrate is in the range of 0.2 to 0.6 μm.

Figure 11:
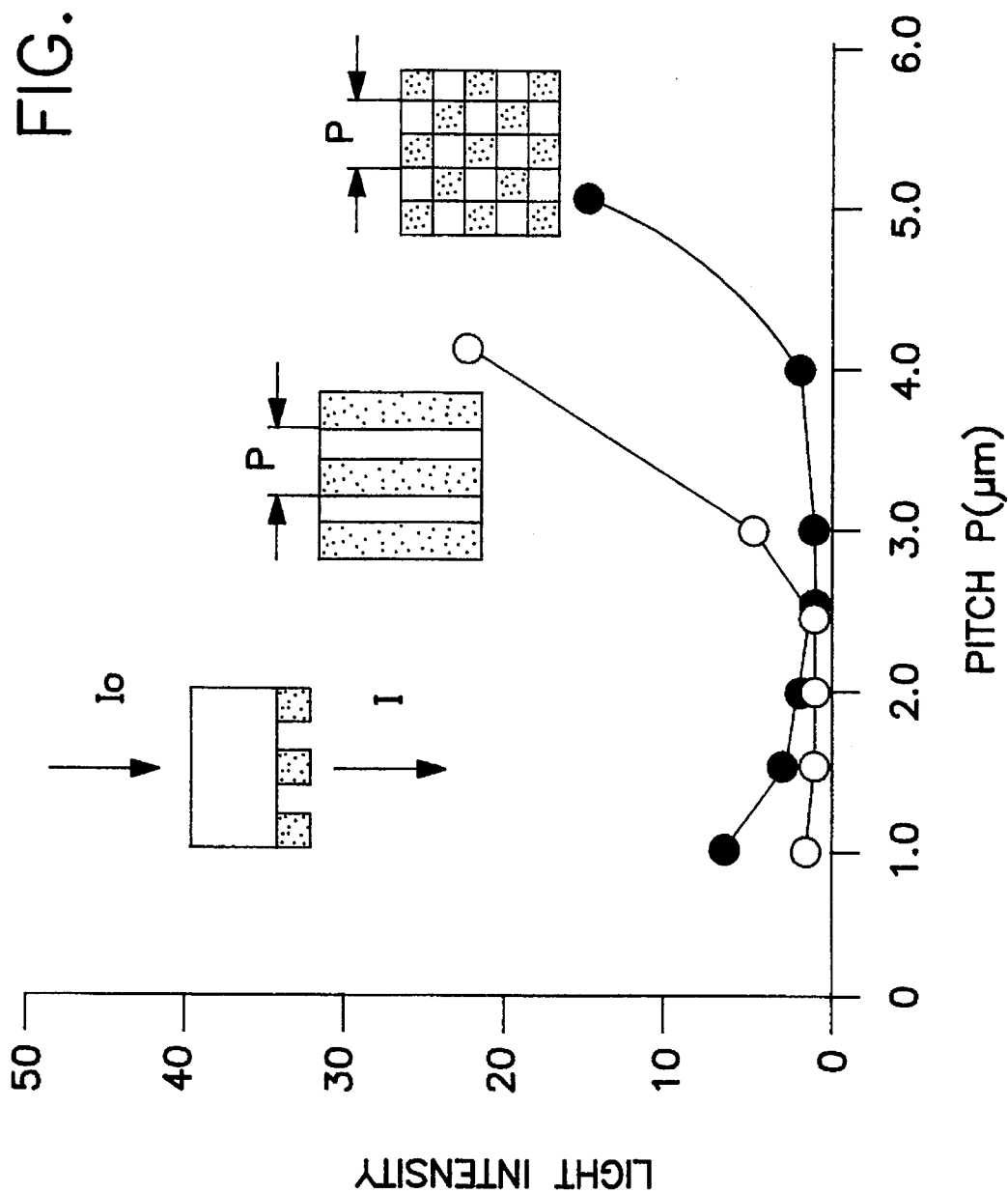
FIG. 11 is a graph showing the relationship between the pitches and light intensity.

FIG. 11 shows the results of the light-shielding performance of the repeated patterns of the phase shifter. The Y-axis indicates a light intensity ratio where I is the light intensity achieved when a light having an intensity of 10 is passed through the transparent phase-shifter mask, and the X-axis indicates the pitch p of the phase shifter pattern. White circles indicate the result of the transparent phase-shifter mask when the phase shift pattern are arranged in a line-and-space, and black circles indicate the result of transparent phase-shifter mask when the phase shifter patterns are repeated in a matrix.

When the phase shifter takes a line-and-space form, the pitch p is in the range of 1.0 to 3.0 μm, the light intensity ratio is within 10%. When the phase shifter pattern is in a matrix, the light intensity is within 10% if the pitch p is in the range of 1.0 to 4.0 μm. In FIG. 11, irrespective of increases in the pitch p the light intensity increases, which indicates that the phase shifter is not shaped as desired.

In order to form a resist pattern for a large-scale area, the phase shifter having a line-and-space pattern can be used on condition that the pitches p are in the range of 1.0 to 3.0 μm, and the phase shifter having a matrix pattern can be used on condition that the pitches p are in the range of 1.0 to 4.0 μm.

By using a repetition of phase shifter patterns having a resolution limit, various patterns can be formed.

Figure 12A:
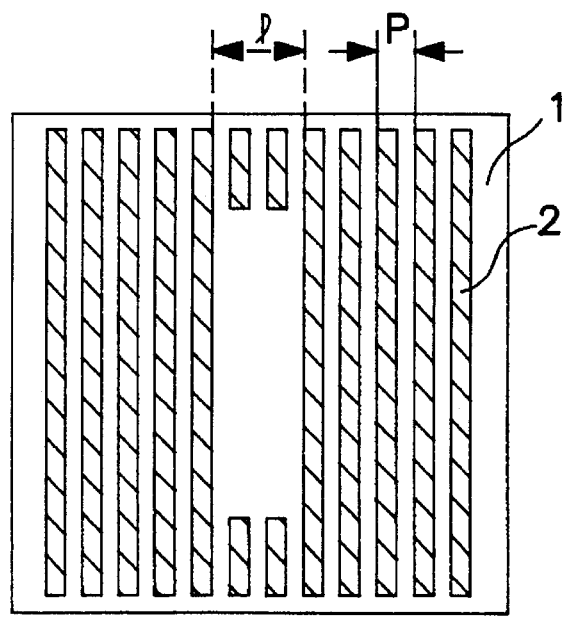
FIGS. 12 (a) and 12 (b) are plan views showing an application of the photomasks of FIG. 10.
Figure 12B:
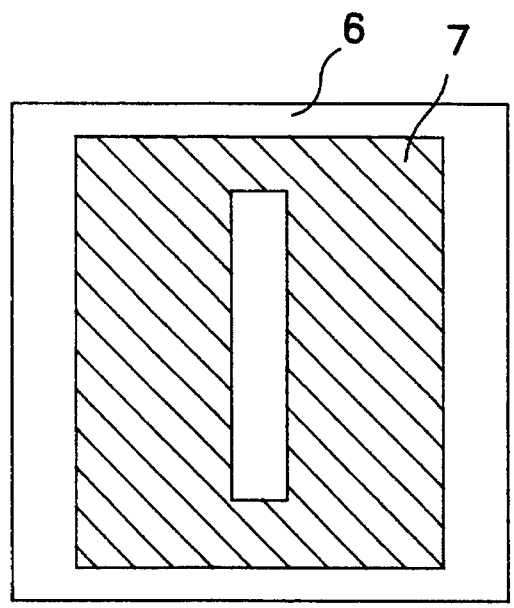

FIG. 12 shows a resist pattern a photomask designed to form a resist pattern in a single form by irradiation exposure and development. FIG. 12 (a) shows transparent phase-shifter masks disposed in a line-and-space shape at pitches below a resolution limit. A space is provided at an interval I in the phase shifter 2.

As shown in FIG. 12 (b), a resist pattern 7 is formed because this area is shielded against an irradiated light, and the resist in the space having the interval I is exposed to an irradiated light passing through the space. In this way the resist pattern 7 has a void portion.

FIGS. 13 (a) to (d) show a variety of transparent phase-shifter masks which allow resist patterns to become a hole pattern. FIG. 13 (a) shows patterns of the phase shifter 2 arranged in a matrix with a pitch p, which is below a resolution limit. One phase shifter 2 in the center is removed, thereby making the entire shape like a cross through which an irradiated light is passed. This cross portion allows an irradiated light to pass through because the pitch is larger than p; more specifically, when an irradiated light passes through the phase shifter 2 and an irradiated light passes through a portion of the photomask substrate 1 which is adjacent to the phase shifter 2, they cancel each other out if their phases are reversed by 180°C. If the mutual cancellation occurs, an irradiated light passes through a portion of the phase shifter 2 where the frequency of the light is disturbed, and contributes to exposure, as shown in FIG. 13 (a).

FIG. 13 (b) shows patterns of the phase shifter 2 arranged at pitches p on the substrate 1, wherein the pitch p is below a resolution limit. There is provided a single phase shifter 2. As a result, the phase shifter 2 takes the form of a cross, which allows an irradiated light to pass through because the pitch is larger than p. Here again, when an irradiated light passes through the phase shifter 2 and an irradiated light passes through a portion of the photomask substrate 1 which is adjacent to the phase shifter 2, they cancel each other out if their phases are reversed by 180°C. If the mutual cancellation occurs, an irradiated light passes through a portion of the phase shifter 2 where the frequency of the light is disturbed, and contributes to exposure.

FIG. 13 (c) shows a line-and-space pattern formed on the substrate 1, with a pitch p being below a resolution limit. The central portion takes the shape of the letter H, where an irradiated light is passed through because the pitch is larger than p.

Figure 13A:
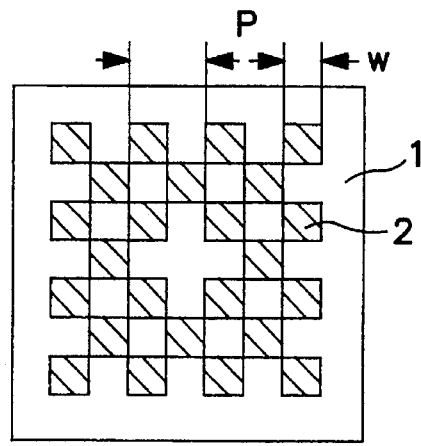
FIGS. 13 (a) to (e) are plan views showing various patterns formed on the photomask to form the blackout portions.
Figure 13D:
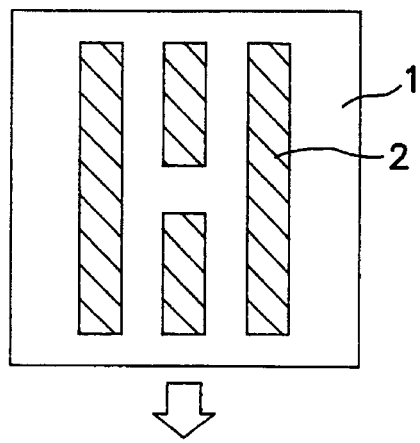
Figure 13B:
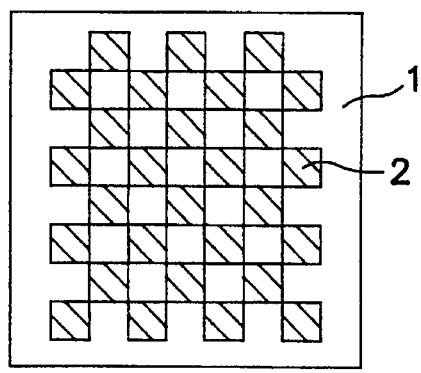

FIG. 13(d) shows a line-and-space pattern formed on the substrate 1, with a pitch p being below a resolution limit. The central portion is void. The void portion takes the shape of the letter H, where an irradiated light is passed through because the pitch is larger than p.

Figure 13E:
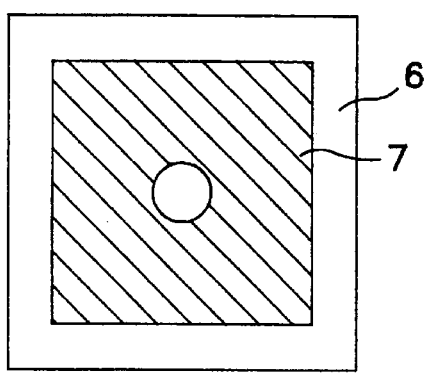
Figure 13C:
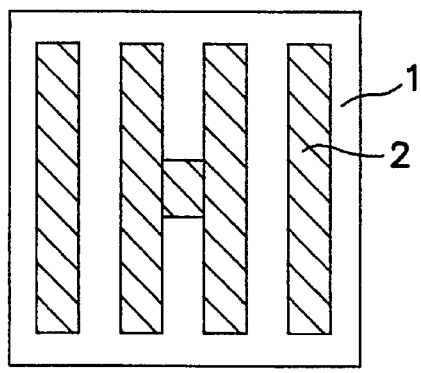

FIG. 13(e) shows a resist pattern 7 formed on the semiconductor substrate 6 by radiating a light upon the transparent phase-shifter mask. The transparent phase-shifter mask allows part of a light to pass through and makes it contribute to exposure. Ideally, a square resist pattern is formed but in the case of intricate patterns a single resist pattern having a circular void.

As described above, the repetition of intricate phase shifter patterns function as a light-shielding layer such as a chromium layer and molybdic silicide layer.

In this way, by using a transparent phase-shifter mask to form a light-shielding area all patterns can be formed without the use of the conventional photomasks. In addition, intricate resist patterns are formed along the periphery of a phase shifter pattern, which means that the width of the resist pattern is fixed under the optical system and difficult to adjust. However, in order to produce LSIs the width of them must be accurately controlled. To this end, it is necessary to distinctly arrange a light-shielding area and a transparent area, the former consisting of a phase shifter portion having a pitch p below a resolution limit, and the latter allowing an irradiated light to pass through. Thus, the widths of a pattern whose dimension is a degree capable of being resolved by the conventional photomask can be controlled. For example, the interval I of the void area of the phase shifter shown in FIG. 12 can be changed so as to control the resulting resist pattern. However, this cannot be applied to a case shown in FIG. 1 where extremely intricate line-and-space pattern.

A method of controlling the widths of intricate patterns by the use of transparent phase-shifter mask will be described:

FIG. 14(a) shows a phase shifter 2 formed in stripes on the substrate 1. Unless the widths of the individual strips of the phase shifter 2 and areas of the substrate 1 that are exposed between the stripes are below a resolution limit, a resist pattern 7 is likely to be formed on a semiconductor substrate 6 as shown in FIG. 14(b) since the exposure is made inadequate because of an decrease in the light intensity caused by edge portions of the phase shifter 2. This indicates that the edge portions of the phase shifter 2 contribute to the exposure of the edge portions of the phase shifter. As a result, the number of the stripes of the resist pattern amounts to be two times that of the phase shifter.

FIG. 14(c) shows a photomask having a first and a second phase shifters 2 crossing each other formed on the substrate 1, wherein the shape of the individual stripes are the same as those shown in shifter are not continuous. More specifically, the stripes of the second phase shifter cross those of the first phase shifter at constant intervals. In other words, each stripe of the first phase shifter 2 has equally spaced projections in opposite directions. These projections act as light-shielders against an irradiated light. The resulting patterns have slightly widened stripes as shown in FIG. 14(d), wherein the letters l, m and n indicate the width of each projection, the projecting length, and ½ (l+m), respectively.

It is necessary to keep the value of l below a resolution limit but not necessary to keep the value of m below the resolution limit because it decides the widths of a resist pattern to be projected. The widths of the resist pattern 7 to be transferred are virtually equal to 2n. The area having a width below a resolution limit acts as a light-shielder against an irradiated light. This means that the width of the resulting resist pattern does not depend upon the value of l but on the value of m. The larger the value of m is, the wider the light-shielder becomes, which means that the width of the resist pattern 7 to be transferred depends upon the length m of the projections.

The light intensity decreases along a sine curve. This is because the resist pattern 7 has a smaller width than the length of the projections.

Figure 15A:
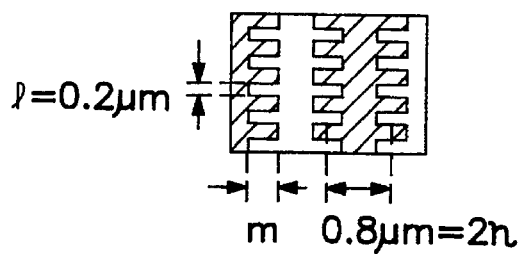
FIGS. 15 (a) to (c) are views exemplifying the relationship between the photomask according to the present invention and the widths of the resist patterns formed by the photomask.

FIG. 15(a) shows the sizes of the phase shifter 2, which has a width of 0.8 μm. This size is equal to 2n, wherein the n is shown in FIG. 14(c). equal to 2n, wherein the n is shown in FIG. 14(c). The width l of the phase shifter 2 shown in FIG. 14(c) is set to 0.2 μm so that the resulting pattern width may be below a resolution limit. The projections have a length of m.

Figure 15B:
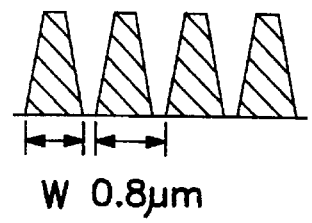

FIG. 15(b) shows a cross-section of a resist pattern formed by exposure and development by using a transparent phase-shifter mask shown in FIG. 15(a). The distance between the resulting resist patterns is equal to 2n. The width of the resist pattern means a width w of the bottom of the resist pattern kept in contact with the semiconductor substrate 6 as shown in FIG. 15(b).

Figure 15C:
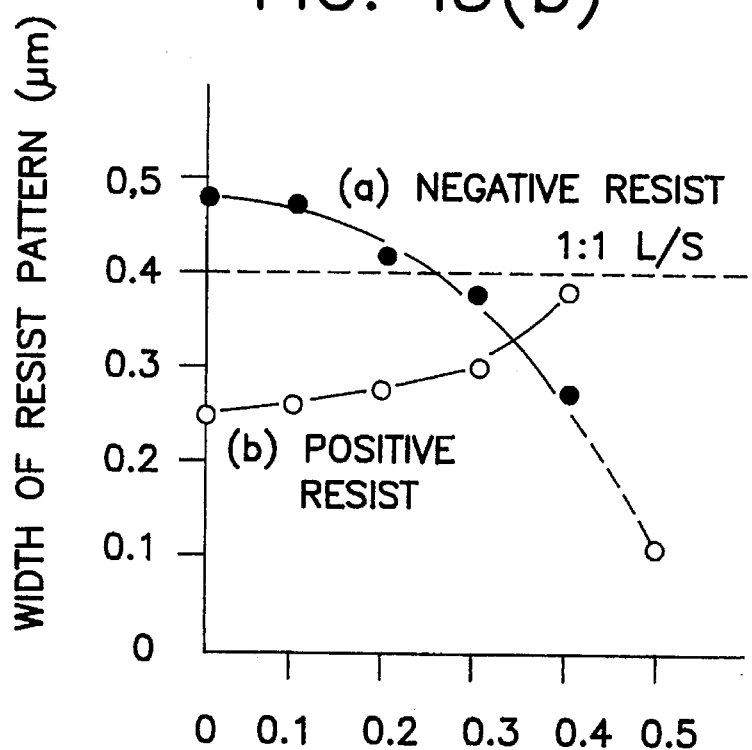

In FIG. 15(c) white circles indicate the results obtained when a positive resist is used, where an area irradiated with light is removed by development. As a result, the resist in a non-exposure area remains as a resist pattern. Black circles indicate the results obtained when a negative resist is used, where an area not irradiated with light is removed by development. As a result, the resist in an irradiated area remains as a resist pattern.

When a positive resist is used, the width w becomes wider in proportion to the length m of the projection. When the length m of the projections is zero, that is, the case of a stripe-shape phase shifter, the width of the resulting resist pattern becomes about 0.25 μm. When the length m is 0.4 μm, the width of the resulting resist pattern becomes 0.4 μm. Thus, a line-and-space pattern is formed at 1:1.

When a negative resist is used, the resist pattern becomes narrower in inverse proportion to the length of the projections. When the length m of the projections is zero, that is, the case of a stripe-shape phase shifter, the width of the resulting resist pattern becomes about 0.48 μm. When the length m of the projections is 0.28 μm, the width w of the resulting resist pattern becomes 0.4 μm. Thus, a line-and-space pattern is formed at 1:1.

In this way, the width of the resist pattern to be transferred by projection and exposure is virtually equal to 2n. The area of a phase shifter having a width below a resolution limit acts as a light-shielding layer against an irradiated light. This indicates that the width of the resulting resist pattern does not depend upon the width l of the phase shifter but upon the length m of the projections. The light-shielding area becomes wider in proportion to the length of the projections.

The width of a resist pattern to be transferred depends upon the length m of the projections.

FIG. 14 (e) shows a phase shifter 2 formed in stripes on the substrate 1 of FIG. 14 (a), wherein the phase shifter 2 is provided with a multi-stage phase shifter 8 along the opposite sides thereof, m and n indicate the width of the multi-stage phase shifter 8 and ½ (the width of the stripe-shape phase shifter 2+m). The value m decides the width of the resist pattern 7 to be projected. The width of the resist pattern 7 to be transferred by projection and exposure is virtually equal to 2n. Thus, the resulting resist pattern 7 becomes thicker in proportion to the value m. The width is equal to the sum of the width of the stripe-shaped phase shifter 2 and m. This means that the width of the resist pattern 7 can be controlled by changing the value of m. The reason why the width of the resist pattern 7 does not exceed the sum of 2m and the width of the stripe-shaped phase shifter 2 is that the light intensity decreases at a sine curve by the edge portions of the projections. As a result, the resist pattern 7 formed by developing an irradiated area is short of the terminating ends of the projections. The light-shielding area becomes wider and results in the pattern shown in FIG. 14 (d).

FIG. 14 (f) shows a photomask having a stripe-shaped inner phase shifter 2a on the substrate 1 of FIG. 14 (a). This inner phase shifter 2a is provided with outer phase shifters 2b along the opposite sides of the inner phase shifter 2a. l, n and m indicate a distance between the centers of the inner phase shifter 2a and the outer phase shifter 2b, the width of the outer phase shifter 2b and an interval between the inner phase shifter 2a and the outer phase shifter 2b, wherein the m and n are below a resolution limit. The width of the resist pattern 7 to be transferred by projection and exposure is virtually equal to 2 l.

Because of the area acting as a light-shielding layer, the width of the resist pattern 7 depends upon the sum of the width n of the outer phase shifter 2b and the interval between the inner and outer phase shifters 2a and 2b. The light-shielding area becomes wider in proportion to the width n of the outer phase shifter 2b and/or the interval between the inner and outer phase shifters 2a and 2b, provided that both values of m and n are below a resolution limit. If the sum of m and n are set to an excessively large value, either of them will come to exceed the resolution limit. In such cases, it is preferable that the pattern consisting of the inner and outer phase shifters 2a and 2b with intervals therebetween should be repeated.

The resulting pattern takes the form shown in FIG. 14 (d).

As is evident from the description with respect to FIG. 14 (a), 14 (c), 14 (e) and 14 (f), intricate patterns can be formed by controlling the widths by the use of the patterns shown therein.

Figure 16A:
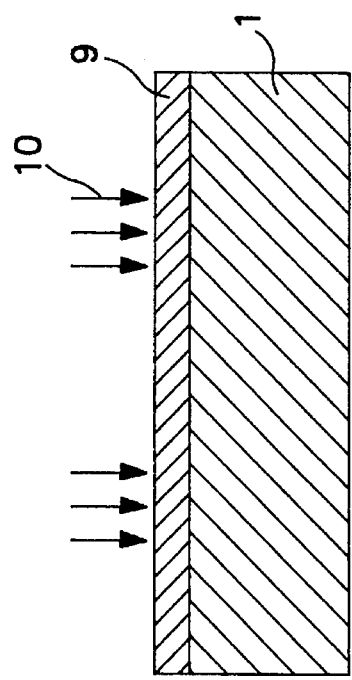
FIGS. 16 (a) and 16 (b) are diagrammatic views exemplifying a process of producing of the photomask according to the present invention.
Figure 16B:
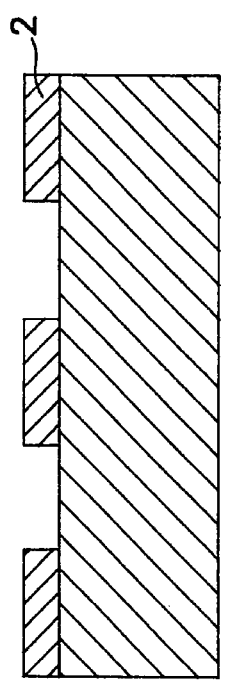

A process of fabricating the transparent phase-shifter mask will be described by way of examples:

A first example will be described by reference to FIG. 16 (a). A quartz substrate 1 is prepared, and a transparent electroconductive layer such as indium tin oxide (hereinafter called ITO layer) is deposited to a thickness of 0.1 μm on the substrate 1. Then, a transparent layer 9 is spin-coated on the substrate 1 as a phase shifter 2. For the transparent layer 9, polymethyl methacrylate (hereinafter called PMMA layer) is spin-coated to a thickness of 0.372 μm. Then, an exposing radiation is applied through electron beams 10 at an accelerating voltage 25 KV by the amount of exposure of about 130 μC/cm². The radiated surface is sprayed with a mixture methylisobutyl ketone (hereinafter called MIBK) and isopropyl alcohol (hereinafter called IPA) at a ratio of 1:2 for three minutes so as to effect development. The development dissolves the exposed part to form a desired pattern. Then, the substrate 1 is rinsed with IPA, and spin-dried. In this way the transparent phase-shifter mask of FIG. 16 (b) is formed.

Preferably, the substrate 1 is covered with an ITO layer to form a desired pattern of PMMA. This ITO layer of electroconductivity is effective to prevent electrons from accumulating in the substrate 1 which is inherently an insulator allowing the accumulation of electrons in the substrate 1. The accumulated electrons are likely to disturb the electron beams 10, thereby distorting a resulting pattern. The ITO layer can be only thick so as not to effect the exposure of the substrate 1 unfavorably. In addition, it is preferable that the PMMA layer is sufficiently thick so as to inverse the phase of an irradiated light by 180°.

A second example will be described by reference to FIG. 17, which is different from the first example in that multi-stage phase shifter 8 is used.

Figure 17A:
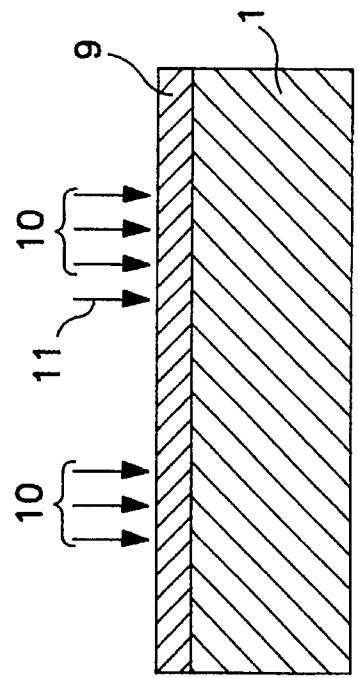
FIGS. 17 (a) and 17 (b) are diagrammatic views exemplifying another example of the process of producing of the photomask according to the present invention.
Figure 17B:
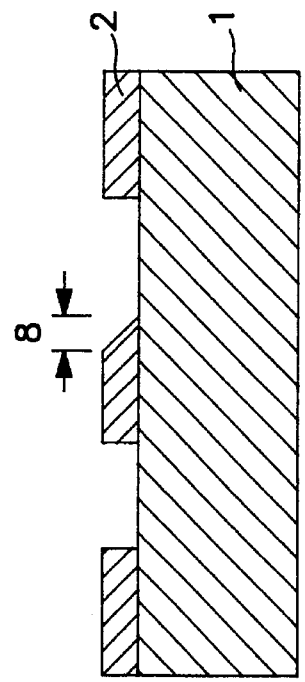

Referring to FIG. 17 (a) a substrate 1 of quartz is prepared, and a transparent layer 9 is deposited on the substrate 1. For the transparent layer 9, a PMMA layer is spin-coated to a thickness of 0.372 µm. Then, an exposing radiation is applied through electron beams 10 at an accelerating voltage 25 KV by the amount of exposure of about 130 µC/cm². In this way a phase shifter 2 having a phase different of 180° is formed. In order to form an area whereby a phase difference of 90° is given between 180° and 0°, the amount of exposure applied thereto is adjusted to 50 µC/cm². In order to form two areas whereby phase differences of 120° and 60° are given between 180° and 0°, the amounts of exposure are set to 45 and 60 µC/cm².

In order to form an area whereby the phase difference is varied from 180° to 0° continuously, it is only necessary to change the amount of exposure in this area continuously from 0 to 130 µc/cm².

In the first example, PMMA is used for the phase shifter 2 which is an organic layer but PMMA may involve a problem of durability; more specifically, when in using a transparent phase-shifter mask to effect a radiating exposure, KrF excimer laser or any other far ultra-violet ray (having a wavelength of 200 nm to 300 nm) is used as a source of light, the problem is often caused because the far ultra-violet ray generates high energy owing to its relatively short wavelength and causes the ablation of the PMMA layer. In order to solve this problem, an effective chemical formula is shown in FIG. 18.

Figure 18A:
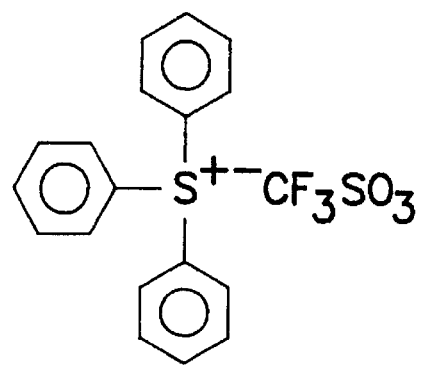
FIGS. 18 (a) and 18 (b) are diagrammatic views showing chemical structures of an electron beam resist for forming a phase shifter for the photomask according to the present invention.
Figure 18B:
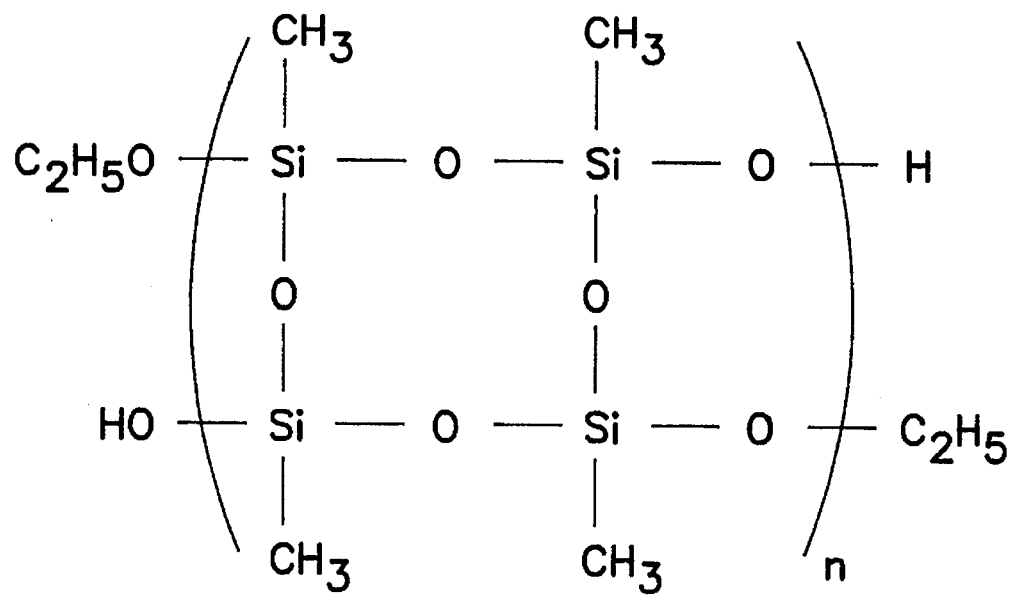

FIG. 18(a) shows the chemical formula of salt-onium that can be used as a photosensitive agent. FIG. 18(b) shows polysiloxane having a ladder structure used as a base resin. The resist used in the example contains a mixture of polysiloxane of FIG. 18(b) as a base resin and a salt-omiun of FIG. 18(a) by 0 to 10 part by weight.

This resist has a high sensitivity of 0.2 µC/cm² to the electron beams, and therefore it is possible to use this resist for the phase shifter instead of the PMMA. Thus a stable phase shifter can be produced by a simple process.

Instead of using polysiloxane for a base resin, any other substance can be used if it consists mainly of polysiloxane having a silicon-base chain structure. Any other agent having such a base resin and having a sensitivity to electron beams can be used as a resist and a phase shifter. For such base resins having a required sensitivity, chloromethylated polysiloxane and clear polymers such as silicon resins containing highly reactive end groups can be used.

A third example will be described by reference to FIG. 18:

A substrate 1 of quarterback is prepared and an ITO layer is deposited on the substrate 1. A transparent layer 9 such as silicon nitride layer and an electron line resist 12 are coated on the substrate 1. For the electron line resist 12 chloromethyl (hereinafter called CMS).

Figure 19A:
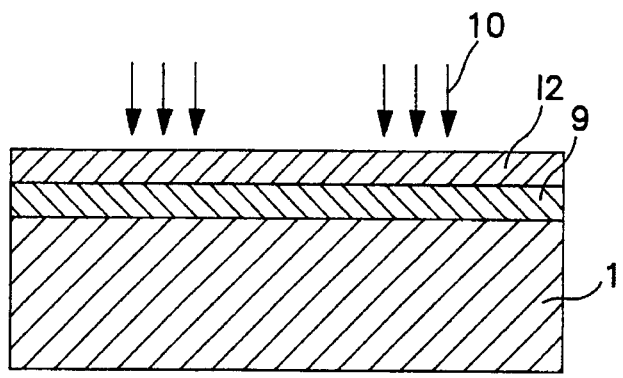
FIGS. 19 (a) to 19 (d) are diagrammatic views exemplifying other example of the process of producing the photomask according to the present invention.

As shown in FIG. 19(a), a silicon nitride layer 9 is formed on the substrate 1 to a thickness of about 0.18 µm by sputtering, followed by the spin-coating of a CMS layer 12 to a thickness of about 0.5 µm. Then, the CMS layer 12 is heated at 120° C. for 30 minutes and hardened.

Figure 19B:
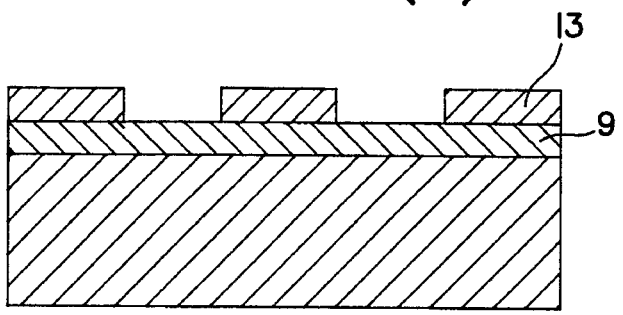

The next step is to expose the desired pattern by using electron beams 10 by an amount of exposure of 6 µ². Then a mixture of isopentyle acetate and ethylene glycol monoethyl ether is sprayed for a minute so as to effect development. In this way the resist pattern 13 is formed as shown in FIG. 19(b).

Figure 19C:
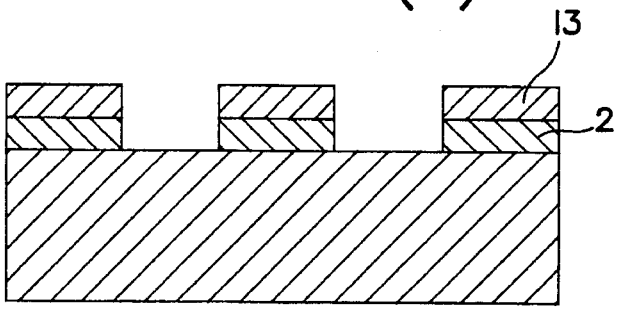
Figure 19D:
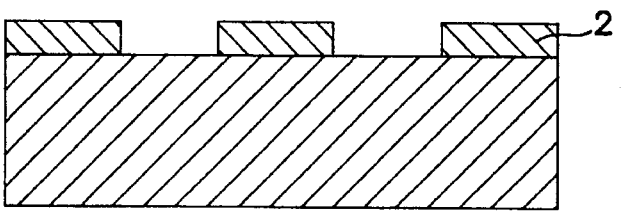

By using the resist pattern 13 as a mask, the silicon nitride layer 9 is dry etched by using a mixture of $CF_4$ and $O_2$ whereby the silicon nitride layer 9 is removed, and the substrate 1 is exposed. The process so far is shown in FIG. 19(c).

the final step is to remove the resist pattern 13 with an oxygen plasma, so as to form the phase shifter 2 of the silicon nitride layer 9. In this way the transparent phase-shifter mask is formed as shown in FIG. 19(d).

Figure 20A:
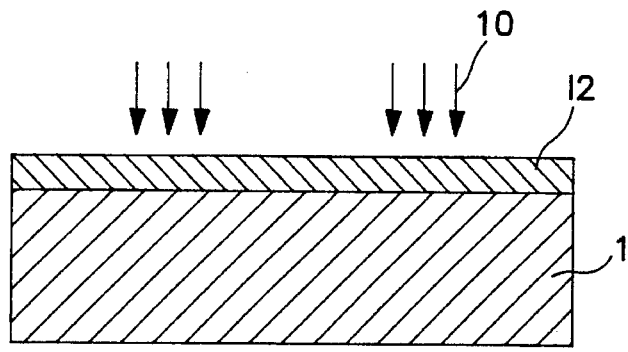
FIGS. 20 (a) to (d) are diagrammatic views exemplifying a further example of the process of producing of the photomask according to the present invention.
Figure 20B:
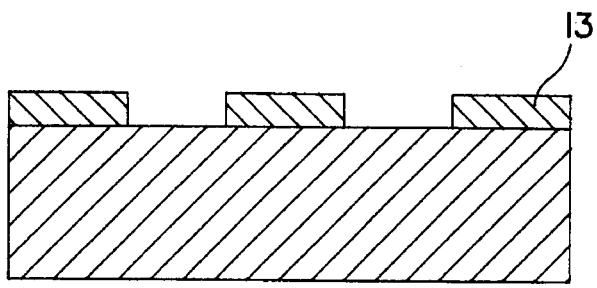
Figure 20C:
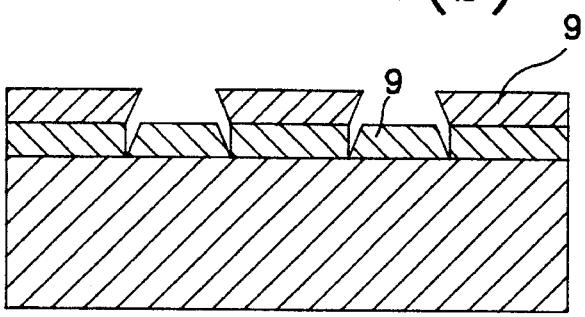
Figure 20D:
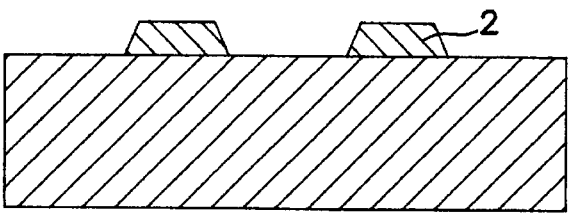
Figure 2I:
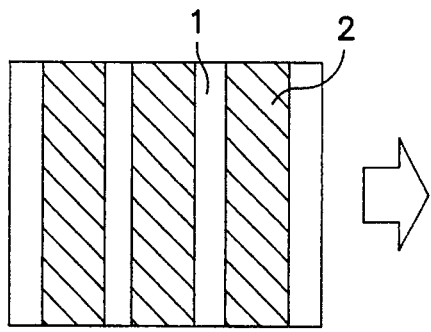
Figure 2I:
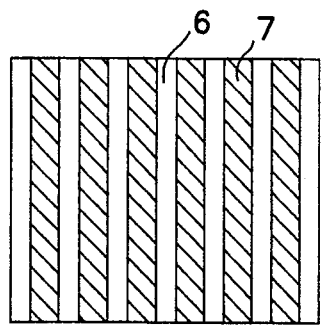
Figure 2I:
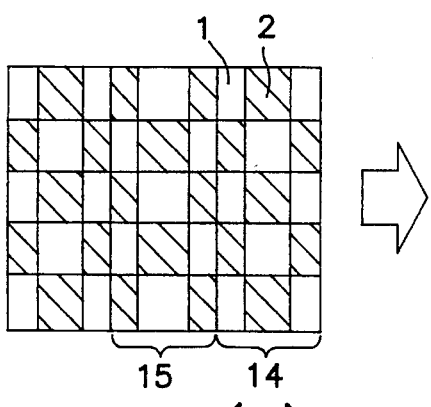
Figure 2I:
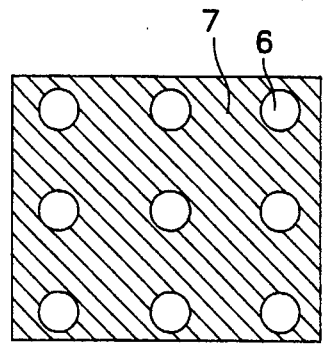
Figure 2I:
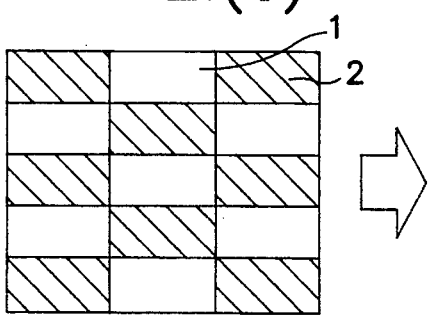
Figure 2I:
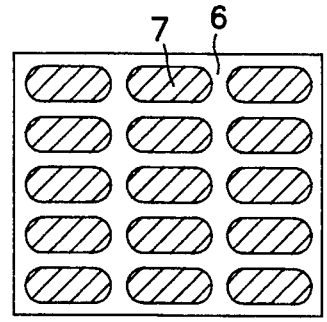
Figure 2I:
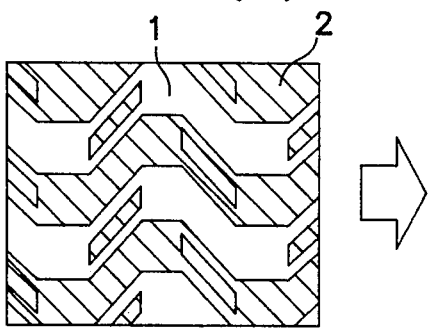
Figure 2I:
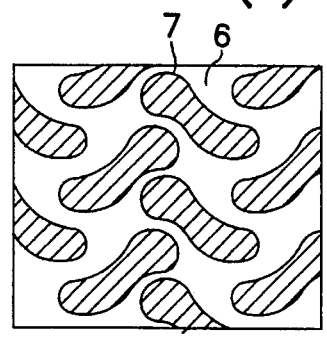

A fourth example will be described by reference to FIG. 20 in which an inorganic layer is formed by vapor deposition for a phase shifter:

A substrate 1 of quartz is prepared and a transparent electroconductivity layer such as an ITO layer is deposited to a thickness of 0.1 µm. Then, a transparent layer 9 such as a PMMA layer is spin-coated to a thickness of 0.5 µm on the substrate 1, followed by a heat treatment at 170° C. for 30 minutes whereby the PMMA layer is dried and hardened. Then, the desired pattern is exposed by using electron beams 10 having an accelerating voltage 25 kV by an amount of exposure of 130 µC/cm². The next step is to develop it with a mixture of MIBK and IPA at a ratio of 1:2 by volume. The development dissolves the exposed area to form a desired resist pattern 13. The substrate 1 is rinsed with IPA and spin-dried. In this way the resist pattern is formed as shown in FIG. 20(b).

The next step is to deposit a transparent layer 9 such as a silicon oxide layer to a thickness of 0.47 µm by vacuum vapor deposition using electron beams, thereby forming a phase shifter 2. The resist pattern 13 is removed by submerging the substrate 1 in aceton, and at the same time the silicon oxide layer on the resist pattern is also removed. However, the silicon oxide layer deposited directly on the substrate 1 remains on the substrate 1. In this way a transparent phase-shifter mask having the phase shifter 2 of silicon oxide layer is formed.

Now, a method of applying the transparent phase-shifter mask according to the present invention to a semiconductor device will be described:

Take the transparent phase-shifter mask obtained as the third example for example. An exposing device is equipped with a ⅕-reduction projector which has an exposing wavelength of 365 nm (i line) and a numerical aperture (NA) of lens of 0.45. The semiconductor substrate 6 is coated with a resist, and is exposed to light through a transparent phase-shifter mask, followed by development. In this way a resist pattern is form on the semiconductor substrate 6.

FIG. 21 (a) shows the transparent phase shifter mask used in the above-mentioned process, indicating the pattern of the phase shifter 2. FIG. 21 (b) shows the resist pattern 7 formed on the semiconductor substrate 6 in the above-mentioned manner. As is evident from FIGS. 21 (a) and 21 (b), the phase shifter 2 has stripes, hereinafter called "stripe-shaped phase shifter". The resist pattern 7 has two times as many stripes as those of the phase shifter 2.

The process using a transparent phase-shifter mask according to the present invention is more advantageous than a process without using any phase shifter, in that the former can achieve a line-and-space pattern with 0.3 μm in intervals whereas the latter produces it only with 0.45 μm in intervals. Furthermore, the latter process cannot constantly form single patterns with fineness of below 0.5 μm. According to the former process, it is possible to produce single patterns with fineness of 0.3 μm constantly.

A process of applying the transparent phase-shifter shifter mask of the present invention to dynamic RAMs (random access memory) will be described:

FIGS. 21 (c), 21 (e), and 21 (g) show transparent phase-shifter masks used for exposure, each indicating the pattern of their phase shifters 2. FIGS. 21 (d), 21 (f), and 21 (g) shows the resist patterns 7 formed on the semiconductor substrate 6 exposed through a transparent phase-shifter mask. These are used as wiring patterns for the semiconductor device.

Referring to FIG. 21 (c), a process of applying a transparent phase-shifter mask to the formation of resist patterns which make contact holes will be described:

An area 14 is constituted by a square phase shifter 2 formed on the substrate 1 and rectangular substrate portion disposed on each side of the square phase shifter 2. An area 15 is constituted by a square substrate portion and rectangular phase shifters 2 disposed on each side of the square substrate portion. The shorter side of each rectangle is half as long as the side of the square, and it is necessary to set the shorter side of the rectangle below a resolution limit. In this way the square phase shifters 2 and the square substrate portions constitute repeated patterns extending in horizontal and vertical directions with light-shielding areas disposed on both sides of the square portions. It is not always necessary for the long side of each rectangle to be equal to the side of each square.

Of irradiated lights, a light passing through edge portions of the phase shifters 2 effects exposure. Lights passing through the rectangular phase shifters 2 and through the rectangular substrate portions adjacent thereto have phases in reverse to each other, thereby reducing the light intensity. This means that the rectangular phase shifter 2 and the rectangular substrate portions provide a light-shielding area in combination against the irradiated light.

Without using the phase shifter 2 the resulting contact hole is only 0.55 μm, whereas the transparent phase-shifter mask enables the formation of contact hole of 0.4 μm.

FIG. 21 (e) shows a transparent phase-shifter mask used for forming a pattern which becomes a capacitor in which rectangular phase shifters 2 and rectangular substrate portions are formed in repeated patterns. FIG. 21 (f) shows the resist pattern formed by using the photomask of FIG. 2 (e).

In order to form a pattern for capacitor, a negative resist is used. Reversely to the examples described above, the exposed area remains as a resist pattern 7 on the semiconductor substrate 6. That is, an area where the light intensity is reduced is developed.

Under the conventional exposure using no transparent phase-shifter mask it is difficult to form elongated rectangular resist patterns with intervals of 0.5 μm or less. When the transparent phase-shifter mask is used, patterns having intervals of 0.2 μm can be formed.

FIG. 21 (g) shows a transparent phase-shifter mask used for forming a pattern allowing the formation of an element separating areas. This pattern includes a step-shaped area and a void-present area which includes a space at the center. In addition, the substrate 1 includes a stepped area in the substrate, and a stepped area in the pattern. In the void-present phase shifter portion and the stepped substrate portion, the phase shifter portion adjacent to the space, and the substrate portion adjacent to the phase shifter have narrow widths. It is necessary to reduce the size of these narrow areas so as to be below a resolution limit.

These areas act as a light-shielder against an irradiated light. The resist patterns 7 to be transferred to the negative resist are shown in FIG. 21 (h) where the pattern is formed by the removal of the resist in the non-exposed area.

Under the conventional method using no transparent phase-shifter mask it is impossible to secure intervals of 0.5 μm or less between the resulting resist pattern and an adjacent resist pattern. In contrast, under the method using a transparent phase-shifter mask of the present invention the pattern intervals can be reduced to 0.2 μm.

There are other forms of transparent phase-shifter mask for forming the resist pattern 7 of FIG. 21 (h).

In order to form patterns by using the transmissive phase-shifter mask, various mask patterns can be prepared depending upon the patterns to be formed. Examples are shown in FIGS. 21(i) and 21(j).

FIG. 21(g), as referred to above, in the void-present phase shifter portion and the stepped substrate portion, the phase shifter portion adjacent to the space, and the substrate portion adjacent to the phase shifter have narrow widths. It is necessary to reduce the size of these narrow areas so as to be below a resolution limit.

The patterns shown in FIGS. 21(g), 21(i), and 21(j) can be selected in accordance with a desired shape of the light-shielding areas where the pattern is formed below a resolution limit.

Figure 21I:
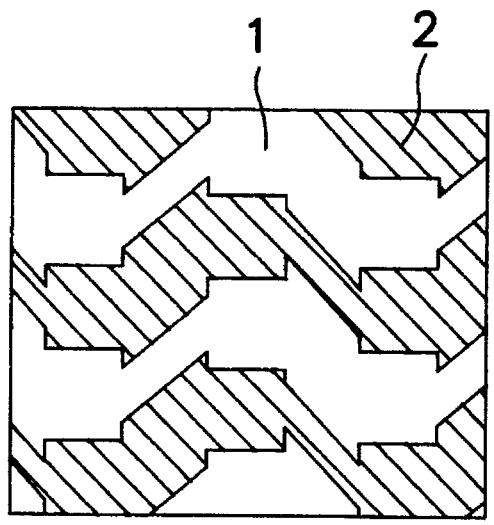
FIGS. 21 (a) to (j) are diagrammatic views exemplifying a further example of the process of producing of the photomask according to the present invention.
Figure 21J:
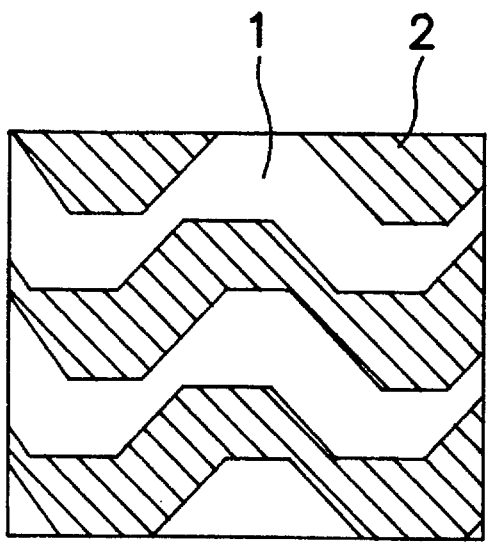

As shown in FIG. 21(g), an area is provided where the phase shifter 2 is formed in the substrate 1 and an area where a void is formed in the phase shifter 2, thereby forming a pattern incapable of resolution. As shown in FIG. 21(i), an area is provided where a phase shifter portion is formed in the area of the substrate 1 in which the phase shifter 2 is formed in the substrate 1 and where the substrate portion is formed in the phase shifter 2, thereby forming a pattern incapable of resolution.

In FIG. 21(i) the phase shifter 2 includes areas having two side lines. Each side line of each area is parallel to an adjacent side line of an adjacent area. If the interval between one side line and an adjacent side line is below a resolution limit, this area acts as a light-shielder against an irradiated light. Likewise, if the intervals between the phase shifter 2 and the substrate portion is below a resolution limit, this area acts as a light shielder against an irradiated light.

Now, referring to FIG. 22, a method of applying a transparent phase-shifter mask to the fabrication of ROMs (read only memory) will be described:

FIG. 22(a) shows a transparent phase-shifter mask in which a stripe-shaped phase shifter 2 is formed on the substrate 1. The light-intensity is reduced by edge portions of the phase shifter 2. When this type of transparent phase-shifter mask is used to transfer a negative resist pattern, such a resist pattern as shown in FIG. 22(b) is likely to remain on the semiconductor substrate 6. This resist pattern is used as patterns for a polysilicon gate. This resist pattern has intervals of about 0.2 μm between the lines.

Under the conventional method using no transparent phase-shifter mask it is impossible to form such intricate pattern by a single exposure but at least exposure must be carried out twice with the use of two photomasks.

Under the method using the transparent phase-shifter mask a single exposure is sufficient. This simplifies the process for fabricating a gate.

Figure 23B:
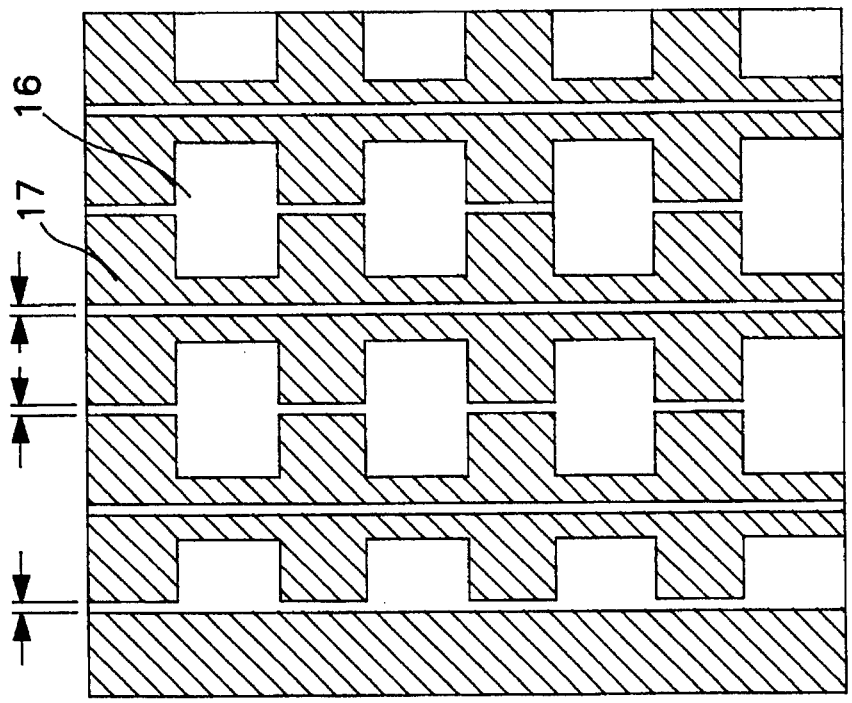
FIGS. 23(a) and 23(b) are plan views showing another shape of the phase shifter achieved when the photomask is applied to a semiconductor substrate.
Figure 23A:
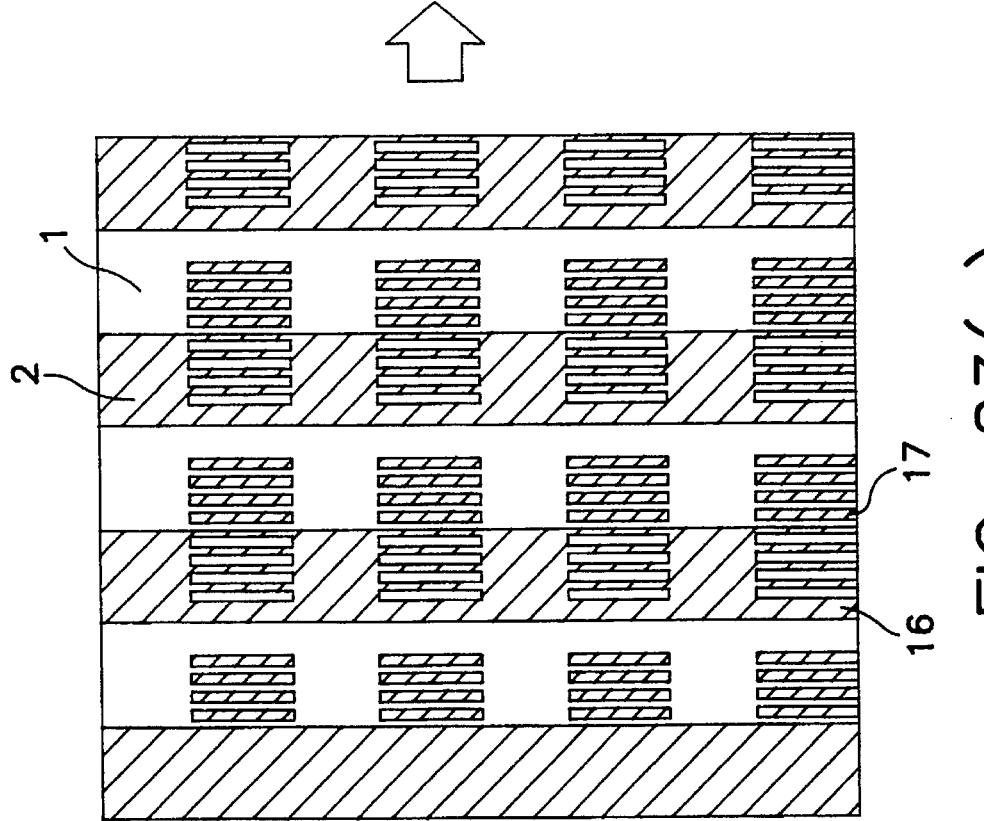

Referring to FIG. 23(a), an example for applying a resist pattern to a CCD solid image pickup device will be described: shifter patterns are utilized. The intervals between the resist patterns are about 0.2 μm at minimum, and in areas where the intervals are wider, the repetition of patterns having a width below a resolution limit is used so as simplify the step for fabricating gates.

Figure 24B:
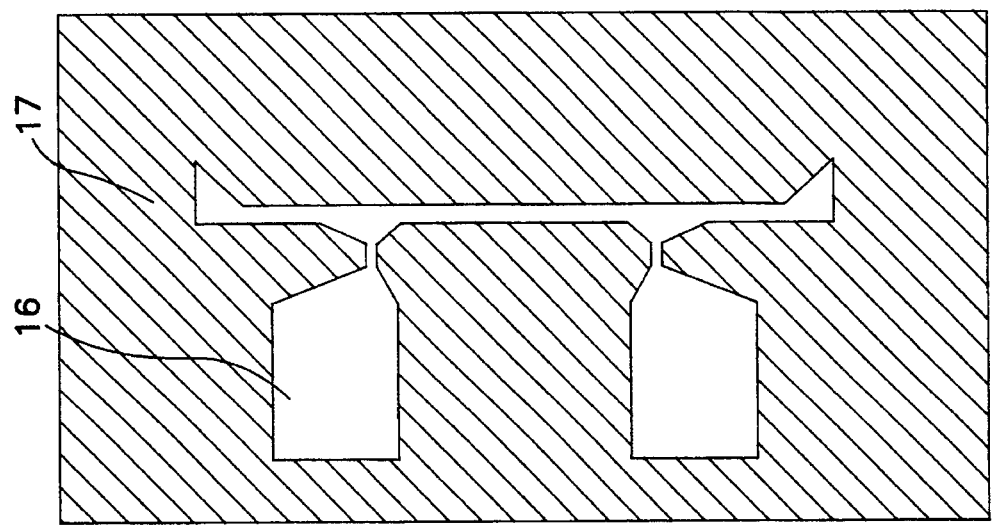
FIGS. 24(a) and 24(b) are plan views showing another shape of the phase shifter achieved when the photomask is applied to a semiconductor substrate.
Figure 24A:
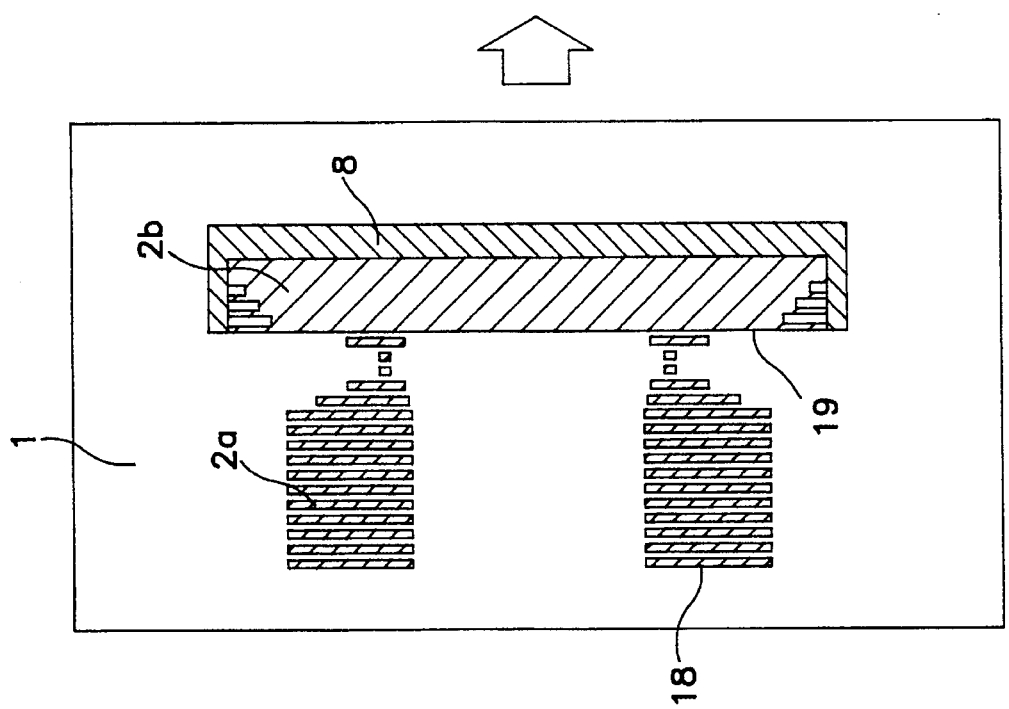

Referring to FIG. 24(a), a method of applying the transparent phase-shifter mask to the formation of intricate gates.

An area 18 is where a take-out electrode 19 is where a gate is formed. The area 18 is constituted by intricate phase shifter portions 2a, and rectangular phase shifter portions 2b have widths below the resolution limit, thereby becoming a light-shielder against an irradiated light. In the rectangular phase shifter portions 2b the light intensity is reduced on the edge portions, thereby enabling a straight gate to be formed along the edges of the phase shifter portions 2b. A resist pattern should not be formed along the three sides other than the side along which the gate is formed. In order to prevent a gate from being formed along these three sides, multi-stage phase shifters 8 are preferably formed along them.

By using this transparent phase-shifter mask a resist pattern is formed by exposure on the semiconductor substrate 6. A negative resist is used so that the area 18 and the rectangular phase shifter potions 2b forming the gate include a light-shielder against an irradiated light. The light-shielding portions get rid of the resist after exposure and development.

A mask used for this purpose is shown in FIG. 23(a). The substrate 1 is provided with two areas 16 and 17; the area 16 is provided by a phase shifter 2 taking the form of a rectangle, and the other area 17 is buried partly in the phase shifter area 16.

The area 17 is formed by a repetition of phase shifter portions incapable of resolution. When a light is radiated, the light intensity in the area 16 is reduced by each side of the rectangular shape. When a negative resist is used, the resist along the edges of the area 16 is reduced. The other area 17 acts as a light-shielder against an irradiated light, thereby making a portion devoid of a resist.

FIG. 23(b) shows a state where the a pattern described above is transferred onto a negative resist by the use of a transparent phase-shifter mask. The area 16 forms a photo-electric converter for a CCD solid image pickup device, and the area 17 forms a vertical transfer channel for reading out an electric charge stored by the photoelectric converter. Intricate fine lines are formed in the vertical transfer channel by the edge portions of the area 16 but such fine lines do not unfavorably affect the characteristics of the vertical transfer channel. If there is a worry about any unfavorable influence, the provision of the multi-stage phase shifter along the longer sides of the rectangular area 16 will eliminated the possibility of forming fine lines in the transfer channel.

In this way, the fine light-shielding areas along the phase shifter, and the repetition of phase Redundant patterns formed along the phase shifter 2 are negated by using multi-stage phase shifter 8. A large-size electrode to the gate is formed by using the pattern of the phase shifter 2 below a resolution limit. This type of transparent phase-shifter mask enables the fabrication of a semiconductor device of GaAs having a gate width of 0.15 μm. Under the conventional method an electron beam drawing process was used to form intricate fine patterns, but because of the necessity of using vacuum, the process was not suitable for the mass-production.

In the illustrated examples, PMMA, siloxane-polymer base resists, silicon nitride layers and silicon oxide layers are used but magnesium fluoride, titanium dioxide, titanium nitride or any other transparent polymers can be used.

In the illustrated examples, reference is made to the phase shifter used in an exposing device having a wavelength for exposure of 365 nm but any other exposing device can be used if the following equation is satisfied:

$$t=\lambda/2(n=1) \tag{2}$$

where t is the thickness of the phase shifter, and n is a diffraction index of the phase shifter.

In the illustrated examples the phase shifter mask consists of patterns formed a transparent photomask substrate for a transparent phase shifter.

Figure 25:
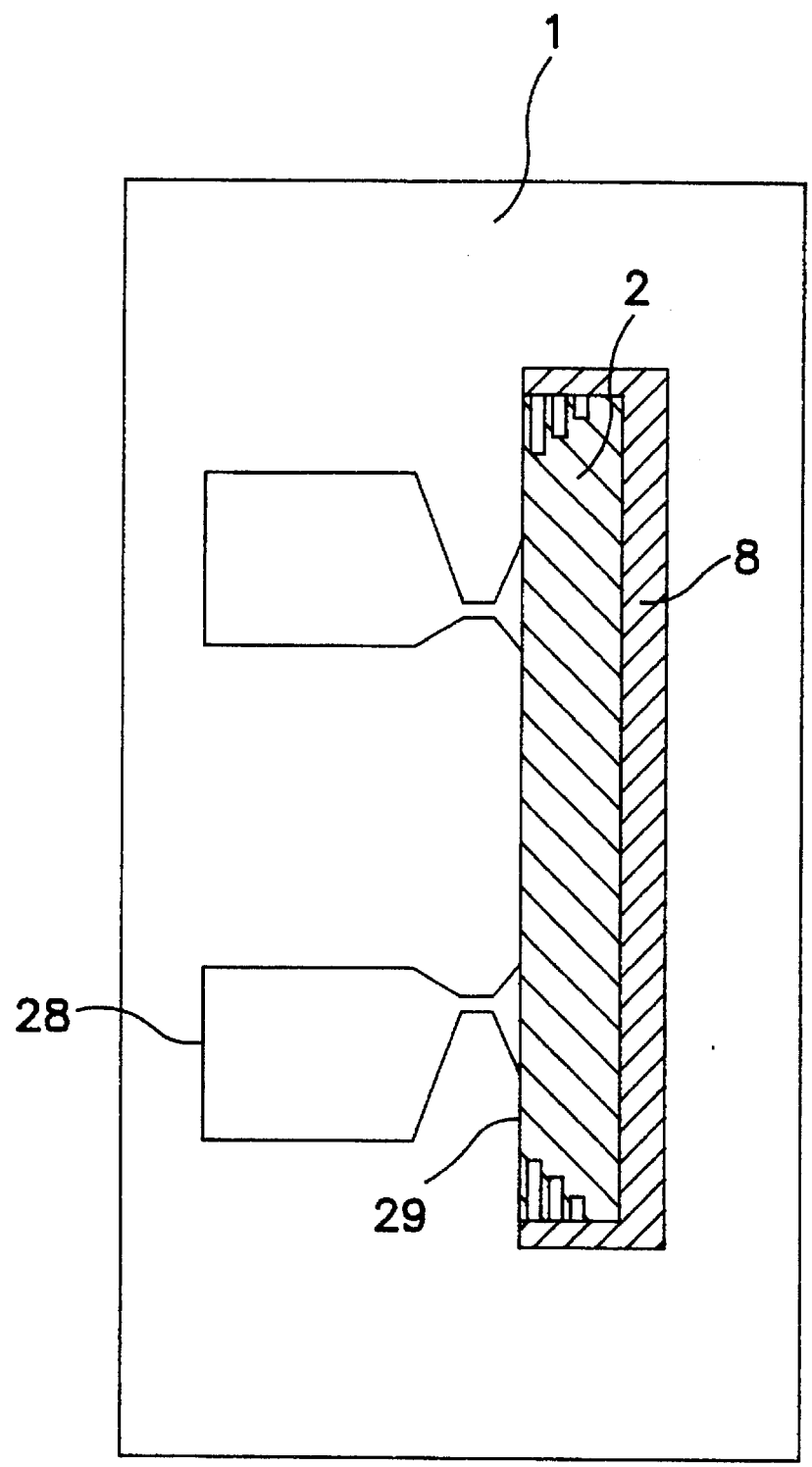
FIG. 25 is a plan view showing another shape of the phase shifter achieved when the photomask is applied to a semiconductor substrate.
Figure 26:
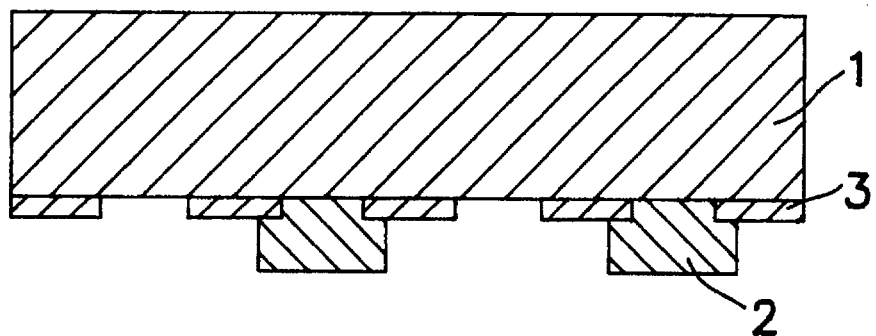
FIG. 26 is a cross-sectional view exemplifying a known phase shifter.
Figure 27:
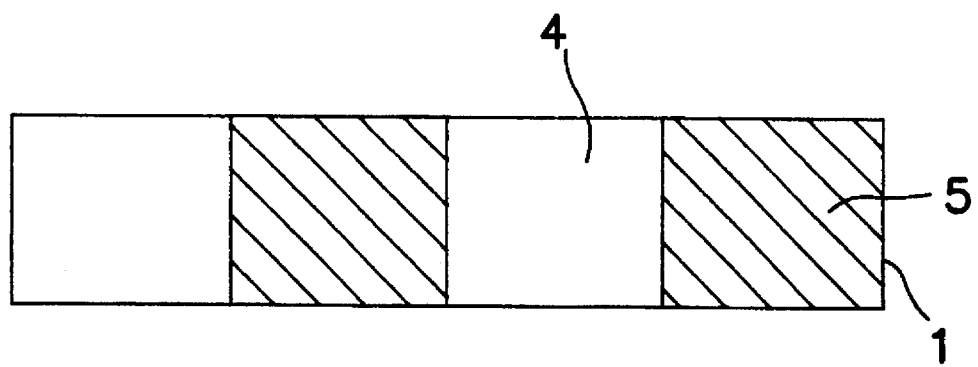
FIG. 27 is a plan view of other known phase shifter shown in FIG. 26.

FIG. 25 shows a photomask having a light-shielding area using a phase shifter and a light-shielding layer such as a chromium layer in combination. The resulting light-shielding pattern will be described by referring to FIG. 25:

In FIG. 25 an electrode to a gate is formed in an area 28, and the gate is formed in an area 29. The area 28 is a light-shielding layer formed by chromium layer or molybdenum silicide.

A rectangular phase shifter 2 has an edge where the light intensity is reduced, thereby forming a straight gate along the edge. No resist pattern should be formed along the three sides other than the side along which the gate is formed. In order to achieve it, multi-stage phase shifters 8 are formed along them.

By using this type of transparent phase shifter mask, a resist pattern is formed by exposure on the semiconductor substrate 6. A negative resist is used so that the area 28 and the rectangular phase shifter 2 forming the gate include a light-shielder against an irradiated light. The light-shielding portions get rid of the resist after exposure and development.

Redundant patterns formed along the phase shifter 2 are negated by using multi-stage phase shifter 8. A large-size electrode to the gate is formed by using the pattern of the phase shifter 2 below a resolution limit. This type of transparent phase shifter mask enables the fabrication of a semiconductor device of GaAs having a gate width of 0.15 μm. Under the conventional method an electron beam drawing process was used to form intricate fine patterns, but because of the necessity of using a vacuum, the process was not suitable for mass-production.

Instead of using a transparent phase-shifter mask for a phase shift mask, it is possible to use a phase shifter and a light-shielding layer such as a chromium layer in combination.

It is understood that various other modifications will be apparent to and can be readily made by those skilled in the art without departing from the scope and spirit of this invention. Accordingly, it is not intended that the scope of the claims appended hereto be limited to the description as set forth herein, but rather than the claims be construed as encompassing all the features of patentable novelty that reside in the present invention, including all features that would be treated as equivalents thereof by those skilled in the art to which this invention pertains.

What is claimed is:

1. A photomask comprising:

a transparent substrate; and patterns of a transparent layer covering an area, wherein said transparent layer has a thickness t defined by the following formula, $$t=(2i-1)\lambda/[2(n-1)]$$

where t is the thickness of the transparent layer, n is a refractive index of the transparent layer, i is an integer and λ is a wavelength of an incident light to the photomask, thereby providing a phase difference of π multiplied by an odd number between light transmitted through the transparent substrate and light transmitted through the transparent layer;

and wherein said patterns of the transparent layer are arranged with a pitch p not larger than four times of a resolution limit R of an optical system defined by the following formula, $$R = K_1 \lambda / NA$$

where $K_1$ is an optical constant of the photomask, λ is a wavelength of an incident light and NA is a numerical aperture of a lens;

whereby the light transmitted through the transparent substrate and the light transmitted through the transparent layer interfere with each other to reduce the light intensity in the whole area covered by said arranged patterns of the transparent layer.

2. A photomask according to claim 1, wherein said optical constant $K_1$ is about 0.35.

3. A photomask according to claim 1, wherein said reduced light intensity is less than 10% of that of the incident light.

4. A photomask according to claim 1, wherein said pitch p is in the range of 1.0 to 4.0 μm.

5. A photomask according to claim 1, wherein said patterns of the transparent layer are arranged in a matrix form.

6. A photomask according to claim 1, wherein:

the plurality of transparent layers patterns arranged with the pitch not larger than four times of the resolution limit R of the optical system includes a void portion in its center, and the light intensity is not reduced at a periphery of said void portion but is reduced in the area covered by the arranged transparent layer patterns.

7. A photomask comprising:

a transparent substrate and a pattern of a transparent layer, at least a part of a peripheral portion of said pattern being gradually diminishing in thickness;

wherein at a peripheral area of said pattern where the thickness is not varied, the thickness t of the transparent layer is defined by the following formula:

$$t = (2i-1)\lambda / [2(n-1)]$$

where t is the thickness of the transparent layer, n is a refractive index of the transparent layer, i is an integer and λ is a wavelength of an incident light, wherein at the peripheral area of said pattern where the thickness is not varied:

a phase difference of π multiplied by an odd number between light transmitted through the transparent substrate and light transmitted through the transparent layer is obtained;

said two lights interfere with one another to reduce the intensity of the lights; and a resist pattern is formed, and further wherein in the peripheral area where the thickness is varied, a resist pattern is not formed.

8. A photomask according to claim 7, wherein said thickness of at least a part of the peripheral area is varied step by step.

9. A photomask according to claim 7, wherein said thickness of at least a part of the peripheral area is varied continuously.

10. A photomask comprising:

a transparent substrate; and patterns of a transparent layer, wherein the photomask does not include a light shielding layer, and wherein said patterns of the transparent layer consisting of:

first transparent layers arranged with a pitch p1 four times larger than the resolution limit R of an optical system defined by the following formula, $$R = K_1 \lambda / NA$$

where $K_1$ is an optical constant of the photomask, λ is a wavelength of incident light and NA is a numerical aperture of the optical system; and second transparent layers crossing the first layer at right angle arranged with a pitch p2 less than four times the resolution limit R of the optical system, wherein said second layer having a width l greater than the resolution limit R of the optical system; and comprising a project portion projected from the first transparent layer having a length of m, wherein said two transparent layers have a thickness t defined by the following formula, $$t = (2i-1)\lambda / [2(n-1)]$$

where t is a thickness of the transparent layer, n is a refractive index of the transparent layer, i is an integer and λ is a wavelength of an incident light to the photomask, thereby providing a phase difference of π or π multiplied by an odd number between the light transmitting the transparent substrate and the light transmitting the transparent layer;

interfering said two lights with each other to reduce the light intensity; and forming resist patterns having a pitch l+m in the doubled number of said first pattern of the transparent layer.

11. A photomask comprising:

a transparent substrate; and patterns of a transparent layer, wherein said patterns of transparent layer consist of:

a first transparent layer having a width w and arranged with a pitch p four times larger than the resolution limit R of an optical system defined by the following formula, $$R = K_1 \lambda / NA$$

where $K_1$ is an optical constant of the photomask, λ is a wavelength of incident light and NA is a numerical aperture of the optical system; and second transparent layers contacting said first transparent layer at both sides of said first transparent layer, disposed in parallel, having a width m, and diminishing in thickness, wherein said first transparent layer has a thickness t defined by the following formula, $t=(2i-1)\lambda/[2(n-1)]$ where t is the thickness of the transparent layer, n is a refractive index of the transparent layer, i is an integer and λ is a wavelength of an incident light to the photomask, thereby providing a phase difference of π multiplied by an odd number between light transmitted through the transparent substrate and light transmitted through the transparent layer;

interfering said two lights with each other to reduce the light intensity; and forming resist patterns having a width of m+w in a number twice that of said first patterns of the transparent layer.

12. A photomask comprising:

a transparent substrate; and patterns of a transparent layer, wherein the photomask does not include a light shielding layer, and wherein said patterns of transparent layer consisting of:

a first transparent layer being arranged with a pitch p four times larger than the resolution limit R of an optical system defined by the following formula, $R=K_1\lambda/NA$ where $K_1$ is an optical constant of the photomask, λ is a wavelength of incident light and NA is a numerical aperture of the optical system; and second transparent layers disposing at a distance m less than the resolution limit R in parallel at both sides of said first layers, having a width n less than R, wherein said two transparent layers have a thickness t defined by the following formula, $t=(2i-1)\lambda/[2(n-1)]$ where t is a thickness of the transparent layer, n is a refractive index of the transparent layer, i is an integer and λ is a wavelength of an incident light to the photomask, thereby providing a phase difference of π or π multiplied by an odd number between a light transmitting the transparent substrate and a light transmitting the transparent layer;

interfering said two lights with each other to reduce the light intensity; and forming resist patterns having a width of m+n in the doubled number of said first pattern of the transparent layer.

13. A photomask according to claim 11 or 12, having a plurality of the patterns of said first transparent layer.

14. A photomask of claim 1, 7, 10, 11 or 12, used with a positive or negative photoresist.

15. A photomask of claim 1, 7, 10, 11 or 12, wherein said pattern of the transparent layers comprises resist containing polysiloxane polymer as a base resin.

* * * * *

UNITED STATES PATENT AND TRADE MARK OFFICE
CERTIFICATE OF CORRECTION

PATENT NO. : 5,605,775
DATED : February 25, 1997
INVENTOR(S) : Watanabe

It is certified that error appears in the above-identified patent and that said Letters Patent is hereby corrected as shown below:

Drawing sheet consisting of Figs. 14(a), Fig. 14(b), Fig. 14(c), Fig. 14(d), Fig. 14(e) and Fig. 14(f) should be deleted to be replaced with the drawing sheet as shown on the attached page.

UNITED STATES PATENT AND TRADE MARK OFFICE
CERTIFICATE OF CORRECTION

PATENT NO. : 5,605,775
DATED : February 25, 1997
INVENTOR(S) : Watanabe

Page 2 of 3

It is certified that error appears in the above-identified patent and that said Letters Patent is hereby corrected as shown below:

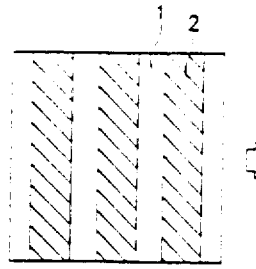

FIG. 14(a)

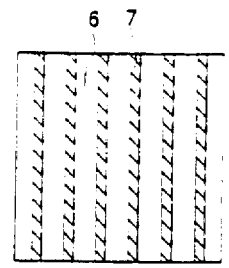

FIG. 14(b)

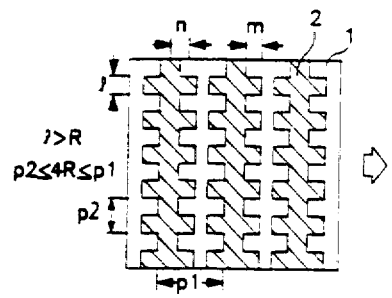

FIG. 14(c)

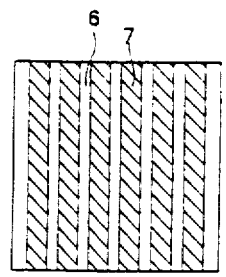

FIG. 14(d)

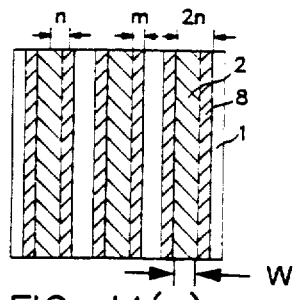

FIG. 14(e)

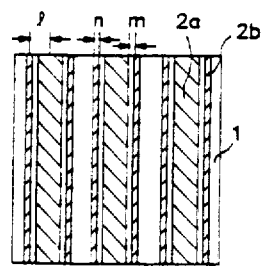

FIG. 14(f)

UNITED STATES PATENT AND TRADE MARK OFFICE
CERTIFICATE OF CORRECTION

PATENT NO.   : 5,605,775
DATED        : February 25, 1997
INVENTOR(S)  : Watanabe It is certified that error appears in the above-identified patent and that said Letters Patent is hereby corrected as shown below:

On the cover page, item [56] References Cited, U.S. Patent Documents, "5,045,417 Kamoto" should be --5,045,417 Okamoto--.

On the cover page, item [56] References Cited, Foreign Patent Documents, "62-259296" should be --62-59296--.

On the cover page, item [56] References Cited, Foreign Patent Documents, --2-590376 11/1985 France-- should be listed.

On the cover page, item [56] References Cited, Foreign Patent Documents, --2-260229 12/1972 Germany-- should be listed.

On the cover page, item [56] References Cited, Other Publications, "EPO Search Report 91110169.3" should be -- EPO Search Report 91110167.3--.

Column 24, lines 9-10, "wherein" should begin a new paragraph.

Signed and Sealed this

Sixteenth Day of June, 1998

Attest:

BRUCE LEHMAN

*Attesting Officer*    *Commissioner of Patents and Trademarks*